US012342710B2

(12) United States Patent
Gao et al.

(10) Patent No.: US 12,342,710 B2
(45) Date of Patent: Jun. 24, 2025

(54) METHOD OF FORMING A PEROVSKITE FILM FOR AN OPTOELECTRONIC DEVICE

(71) Applicant: COMMONWEALTH SCIENTIFIC AND INDUSTRIAL RESEARCH ORGANISATION, Australian Capital Territory (AU)

(72) Inventors: Mei Gao, Glen Waverley (AU); Chuantian Zuo, Beijing (CN); Doojin Vak, Noble Park North (AU)

(73) Assignee: COMMONWEALTH SCIENTIFIC AND INDUSTRIAL RESEARCH ORGANISATION, Australian Capital Territory (AU)

( * ) Notice: Subject to any disclaimer, the term of this patent is extended or adjusted under 35 U.S.C. 154(b) by 1047 days.

(21) Appl. No.: 17/284,044

(22) PCT Filed: Oct. 7, 2019

(86) PCT No.: PCT/AU2019/051081
§ 371 (c)(1),
(2) Date: Apr. 9, 2021

(87) PCT Pub. No.: WO2020/073082
PCT Pub. Date: Apr. 16, 2020

(65) Prior Publication Data
US 2021/0383977 A1   Dec. 9, 2021

(30) Foreign Application Priority Data

Oct. 10, 2018   (AU) .................................. 2018903824

(51) Int. Cl.
*H01G 9/00* (2006.01)
*H01G 9/20* (2006.01)
(Continued)

(52) U.S. Cl.
CPC ........... *H10K 71/12* (2023.02); *H01G 9/0036* (2013.01); *H01G 9/2009* (2013.01); *H10K 30/30* (2023.02);
(Continued)

(58) Field of Classification Search
CPC ........ H10K 71/12; H10K 71/40; H10K 30/30; H10K 85/1135; H10K 85/215; H10K 85/30; H10K 85/111
See application file for complete search history.

(56) References Cited

U.S. PATENT DOCUMENTS

| 2006/0159849 | A1  | 7/2006  | Morita et al. |
| 2015/0307403 | A1* | 10/2015 | Takeuchi ............. B41J 2/14233 73/514.01 |
| 2016/0380221 | A1  | 12/2016 | Gotanda et al. |

FOREIGN PATENT DOCUMENTS

| EP | 2 799 154    | 11/2014 |
| KR | 20090108863  | 10/2009 |

(Continued)

OTHER PUBLICATIONS

Sirringhaus et al, Science, Dec. 15, 2000; vol. 290; 2123-2126.
(Continued)

*Primary Examiner* — Peniel M Gumedzoe
(74) *Attorney, Agent, or Firm* — Foley & Lardner LLP

(57) ABSTRACT

The invention provides a method of forming a perovskite film for an optoelectronic device, the method comprising: applying a perovskite precursor solution to at least one part of a hydrophilic region of a substrate, wherein the hydrophilic region is bounded by a hydrophobic boundary; allowing the perovskite precursor solution to spread over the hydrophilic region, wherein the perovskite precursor solution is retained within the hydrophilic region by at least a portion of the hydrophobic boundary; and drying the perovskite precursor solution to form a perovskite film on the hydrophilic region.

21 Claims, 11 Drawing Sheets

(51) Int. Cl.
  *H01L 51/00*    (2006.01)
  *H01L 51/42*    (2006.01)
  *H10K 30/30*    (2023.01)
  *H10K 71/12*    (2023.01)
  *H10K 71/40*    (2023.01)
  *H10K 85/50*    (2023.01)
  *H10K 30/10*    (2023.01)
  *H10K 30/50*    (2023.01)
  *H10K 85/10*    (2023.01)
  *H10K 85/20*    (2023.01)
  *H10K 85/30*    (2023.01)

(52) U.S. Cl.
  CPC .............. *H10K 71/40* (2023.02); *H10K 85/50* (2023.02); *H10K 30/10* (2023.02); *H10K 30/50* (2023.02); *H10K 85/111* (2023.02); *H10K 85/1135* (2023.02); *H10K 85/215* (2023.02); *H10K 85/30* (2023.02)

(56) References Cited

FOREIGN PATENT DOCUMENTS

| | | |
|---|---|---|
| KR | 10-1374072 B1 | 3/2014 |
| KR | 20180043518 A | 4/2018 |

OTHER PUBLICATIONS

Deng Yeaho et al, "Surfactant-controlled ink drying enables high-speed deposition of perovskite files for efficient photovoltaic modules", Nature Energy Nature Publishing Group UK, London, vol. 3, No. 7, May 14, 2018 pp. 560-566.

Extended European Search Report dated Jul. 12, 2022 in EP 19871045.1.

Zhen et al.; "Scalable fabrication of perovskite solar cells" Nature Reviews Materials, vol. 3, No. 4, Mar. 27, 2018.

Folkers et al., "Self-Assembled Monolayers of Long-Chain Hydroxamic Acids on the Native Oxides of Metals," Langmuir, vol. 11, No. 3, pp. 813-824 (1995).

Kagan et al., "Organic-Inorganic Hybrid Materials as Semiconducting Channels in Thin-Film Field-Effect Transistors," Science, vol. 286, pp. 945-947 (Oct. 1999).

Kagan et al., "Patterning organic-inorganic thin-film transistors using microcontact printed templates," Applied Physics Letters, vol. 79, No. 21, pp. 3536-3538 (Nov. 2001).

Wu et al., "Pinhole-free Hybrid Perovskite Film with Arbitrarily-Shaped Micro-Patterns for Functional Optoelectronic Devices," Nano Letters vol. 17, pp. 3563-3569 (Apr. 2017).

Zhao et al., "High-Performance Inverted Planar Heterojunction Perovskite Solar Cells Based on Lead Acetate Precursor with Efficiency Exceeding 18%," Advanced Functional Materials, vol. 26, pp. 3508-3514 (2016).

* cited by examiner

METHOD OF FORMING A PEROVSKITE FILM FOR AN OPTOELECTRONIC DEVICE

CROSS-REFERENCE TO RELATED APPLICATIONS

The present application is the U.S. National Stage of International Application No. PCT/AU2019/051081, filed Oct. 7, 2019, and claims priority to Australian Patent Application No. 2018903824, filed Oct. 10, 2018.

TECHNICAL FIELD

The invention relates to methods of forming a perovskite film for an optoelectronic device. The methods include applying a perovskite precursor solution to at least a part of a hydrophilic region of a substrate, and drying the perovskite precursor solution to form a perovskite film on the hydrophilic region. The perovskite solution when applied may spread over the hydrophilic region, in response to adhesive forces between the solution and the surface of the hydrophilic region, and may be retained within the hydrophilic region by a hydrophobic boundary which bounds the hydrophilic region. The invention also relates to systems which include a substrate comprising a hydrophilic region, and an applicator for applying a perovskite precursor solution to at least one part of the hydrophilic region.

BACKGROUND OF INVENTION

Thin-film solar cells including a perovskite light-absorbing layer are currently of great interest in the field of renewable power generation. Perovskite films also have potential applications in many other optoelectronic devices, including light emitting diodes, photo diodes, transistors and memories.

Perovskite light absorbing films for optoelectronic devices are characterised by a hybrid organic-inorganic perovskite crystalline structure. Conventionally, such perovskites include crystal planes repeating in three dimensions, and comprise organic cations (A) such as methylammonium (MA) or formamidinium (FA), metallic cations (M) (usually $Pb^{2+}$ or $Sn^{2+}$), and halide anions (X) (I, Br, Cl) according to the formula $AMX_3$. These 3D perovskite materials possess many attractive properties for photovoltaic applications, including a high light-absorption coefficient, high charge-carrier mobility, and fabrication via low-cost solution processing techniques. Disadvantages of 3D perovskites include low environmental stability caused by weak light-induced interactions between the organic cations and surrounding halide anions and a susceptibility to hydrolytic reactions of the organic cations on expose to moisture.

Layered 2D perovskites, which include two-dimensional perovskite crystalline "slabs" composed of multiple $AMX_3$ monolayers, are thus receiving increasing attention for optoelectronic applications due in part to their considerably higher stability compared to 3D perovskites. Ruddlesden-Popper 2D perovskites have the formula $R_2A_{n-1}M_nX_{3n+1}$; $n=1 \to \infty$, where R is a larger organic cation such as phenylethylammonium (PEA) or butylammonium (BA), n corresponds to the average number of monolayers in each crystalline perovskite slab and A, M and X are as described for 3D perovskites. The longer alkyl chains or aromatic moieties of these larger cations act as spacers between the slabs and thus stabilise the perovskite crystal structure. Moreover, the hydrophobic nature of the cationic spacers is thought to reduce penetration of water molecules into the perovskite lattice, contributing to a prolonged device lifetime in high humidity environments. However, the efficiency of solar cells comprising 2D perovskites has remained relatively low compared with 3D perovkite counterparts.

Many reported studies rely on the use of spin-coating techniques to produce high quality perovskite films. While efficient for laboratory experiments, such methods are unsuited to commercial scale-up and cannot produce films having specific target shapes on a substrate. A key requirement for the wide-spread adoption of perovskite optoelectronic devices, whether based on 2D or 3D structures, is thus the development of low cost and scalable fabrication techniques capable of producing perovskite films of high quality, and preferably also in a variety of shapes and configurations.

Techniques such as slot-die coating and printing have been proposed for producing 3D perovskite films, including on flexible substrates in roll-to-roll (R2R) processes. However, slot die coating techniques are unsuited to the production of many desirable film shapes, and the control of perovskite film quality remains a challenge. Printing techniques in principle afford greater flexibility in perovskite film shape, but control of perovskite film thickness is challenging due to the difficulty in printing a precise and consistent loading of precursor solution over the target area. Moreover, the production of finely resolved and closely located perovskite film features is complicated by the susceptibility of the printed precursor solution to coalesce on the substrate prior to drying.

The scale-up challenges are considered particularly acute for 2D perovskite films, because the orientation of the 2D crystalline slabs in the film affects device performance. To date, satisfactory scalable techniques for preparing high quality 2D perovskite films have not been developed.

There is therefore an ongoing need for new methods to form perovskite films for optoelectronic devices, which at least partially address one or more of the above-mentioned short-comings, or provide a useful alternative.

A reference herein to a patent document or other matter which is given as prior art is not to be taken as an admission that the document or matter was known or that the information it contains was part of the common general knowledge as at the priority date of any of the claims.

SUMMARY OF INVENTION

In accordance with a first aspect, the invention provides a method of forming a perovskite film for an optoelectronic device, the method comprising: applying a perovskite precursor solution to at least one part of a hydrophilic region of a substrate, wherein the hydrophilic region is bounded by a hydrophobic boundary; allowing the perovskite precursor solution to spread over the hydrophilic region, wherein the perovskite precursor solution is retained within the hydrophilic region by at least a portion of the hydrophobic boundary; and drying the perovskite precursor solution to form a perovskite film on the hydrophilic region.

In some embodiments, the perovskite precursor solution spreads over the hydrophilic region in response to adhesive forces between the perovskite precursor solution and a surface of the hydrophilic region.

In some embodiments, a volume of the perovskite precursor solution sufficient to cover the entire hydrophilic region is applied. The volume may be selected to produce a target thickness of the perovskite film based on a known surface area of the hydrophilic region and a known concentration of the perovskite precursor solution.

In some embodiments the perovskite precursor solution is entirely retained within the hydrophilic region by the hydrophobic boundary.

In some embodiments the substrate comprises a surface layer comprising a hydrophilic composition, and the hydrophilic region is on the surface layer. The surface layer may have a thickness of between about 20 nm and about 2000 nm.

In some embodiments, the hydrophilic region comprises a hydrophilic composition selectively located on a hydrophobic surface of the substrate, and the hydrophobic surface adjacent to the hydrophilic region defines the hydrophobic boundary. The water contact angle of the hydrophobic surface may be greater than 50°, such as greater than 60°, for example as determined by placing a 2 µL droplet on a dried surface and measuring the water contact angle using a water contact angle measuring system such as a Dataphysics OCA 15EC. The hydrophobic surface may be selected from the group consisting of polymer surfaces and metallic surfaces.

The hydrophilic composition may be a hydrophilic semiconductor for transporting charge to and/or from the perovskite film in the optoelectronic device, such as a hole transport semiconductor, which may be selected from the group consisting of PEDOT:PSS and conjugated polymers with ionic or polar side chains.

In some embodiments, the hydrophilic region is a region of a hydrophilic surface of the substrate, and a hydrophobic composition selectively located on the hydrophilic surface adjacent to the hydrophilic region defines the hydrophobic boundary. The water contact angle of the hydrophobic composition may be greater than 50°, such as greater than 60°, or greater than 90°, for example as determined by placing a 2 µL droplet on a dried surface and measuring the water contact angle using a water contact angle measuring system such as a Dataphysics OCA 15EC. The hydrophobic composition may comprise at least one selected from the group consisting of hydrophobic polymers, hydrophobic organic small molecules, metals and metal oxides. The hydrophobic composition may be present at least partially as a line on the hydrophilic surface. In some such embodiments, the line defines a hydrophobic boundary of adjacent hydrophilic regions of the substrate, and the method comprises separately applying the perovskite precursor solution to parts of the adjacent hydrophilic regions to form unconnected perovskite films on the adjacent hydrophilic regions. The line may have a thickness of less than about 1 mm, preferably less than about 0.5 mm.

In some embodiments the perovskite film is formed in a geometric shape, pattern or indicium by the hydrophobic boundary.

In accordance with a second aspect the invention provides a method of forming a perovskite film for an optoelectronic device, the method comprising: applying a perovskite precursor solution to at least one part of a hydrophilic region of a substrate; allowing the perovskite precursor solution to spread over the hydrophilic region in response to adhesive forces between the perovskite precursor solution and a surface of the hydrophilic region; and drying the perovskite precursor solution to form a perovskite film on the hydrophilic region.

In some embodiments of the second aspect the hydrophilic region is bounded by a hydrophobic boundary, wherein the perovskite precursor solution is retained within the hydrophilic region by at least a portion of the hydrophobic boundary.

In some embodiments of the second aspect the substrate comprises a surface layer comprising a hydrophilic composition, and the hydrophilic region is on the surface layer. The surface layer may have a thickness of between about 20 nm and about 2000 nm. The hydrophilic composition may be a hydrophilic semiconductor for transporting charge to and/or from the perovskite film in the optoelectronic device, such as a hole transport semiconductor, which may be selected from the group consisting of PEDOT:PSS and conjugated polymers with ionic or polar side chains.

In some embodiments of the first and second aspects the water contact angle of the hydrophilic region is less than 45°, such as less than 30°, or less than 10°, for example as determined by placing a 2 µL droplet on a dried surface and measuring the water contact angle using a water contact angle measuring system such as a Dataphysics OCA 15EC.

In some embodiments of the first and second aspects the perovskite precursor solution has a viscosity in the range of 0.6 to 600 mPa·s.

In some embodiments of the first and second aspects the temperature of the perovskite precursor solution on the hydrophilic region is at least 30° C., such as in the range of 40° C. to 80° C., during the drying.

In some embodiments of the first and second aspects the method further comprises heating the substrate to a temperature of at least 30° C., such as in the range of 40° C. to 80° C., at least one of before, during and after the applying. In some such embodiments, the substrate is heated before the applying.

In some embodiments of the first and second aspects the method comprises separately applying the perovskite precursor solution to a plurality of hydrophilic regions of the substrate to form perovskite films on each of the hydrophilic regions. The perovskite films may be formed in a pattern on the substrate.

In some embodiments of the first and second aspects the perovskite precursor solution is a lead (Pb) perovskite precursor solution. The concentration of Pb in the perovskite precursor solution may be less than 0.7 mol/litre, such as less than 0.6 mol/litre, or less than 0.5 mol/litre, such as between about 0.2 and about 0.3 mol/litre.

In some embodiments of the first and second aspects the perovskite precursor solution is a 2D perovskite precursor solution. The 2D perovskite may be of the form $R_2A_{n-1}Pb_nX_{3n+1}$, wherein each A is independently an organic cation selected from the group consisting of methylammonium (MA) and formamidinium (FA), each R is an organic cation larger than each A, for example selected from the group consisting of phenylethylammonium (PEA) and butylammonium (BA), and each X is independently a halide anion. The 2D perovskite may be of the form $(BA)_2(MA)_3Pb_4I_{13}$.

In some embodiments of the first and second aspects applying the perovskite precursor solution comprises drop casting the perovskite precursor solution onto the hydrophilic region.

In some embodiments of the first and second aspects applying the perovskite precursor solution comprises applying a line of the perovskite precursor solution to the hydrophilic region.

In some embodiments of the first and second aspects the method further comprises feeding the substrate in the form of a web beneath an applicator, wherein the applicator applies the perovskite precursor solution to the at least a part of the hydrophilic region as the hydrophilic region is fed past the applicator.

In accordance with a third aspect the invention provides a system, comprising: a substrate comprising a hydrophilic region, wherein the hydrophilic region is bounded by a hydrophobic boundary; and an applicator for applying a perovskite precursor solution to at least a part of the hydrophilic region, wherein the perovskite precursor solution once applied will spread over the hydrophilic region and be retained within the hydrophilic region by at least a portion of the hydrophobic boundary.

In some embodiments of the third aspect, the system further comprises a feeder configured to feed the substrate in the form of a web beneath the applicator, wherein the applicator is configured to apply the perovskite precursor solution to the at least a part of the hydrophilic region as the hydrophilic region is fed past the applicator.

In some embodiments of the third aspect, the system further comprises a heater to heat the substrate to a temperature of at least 30° C., such as a temperature in the range of 40° C. to 80° C. The heater may comprise a heated surface configured to contact the substrate at least one of before, during and after the applying.

In some embodiments of the third aspect, the system further comprises a reservoir containing a perovskite precursor solution for application via the applicator.

In some embodiments of the third aspect, the applicator is configured to drop the perovskite precursor solution onto the hydrophilic region.

In some embodiments of the third aspect, the applicator is configured to apply a line of the perovskite precursor solution to the hydrophilic region.

In accordance with a fourth aspect the invention provides a perovskite film for an optoelectronic device, produced by a method according to any of the embodiments disclosed herein.

Where the terms "comprise", "comprises" and "comprising" are used in the specification (including the claims) they are to be interpreted as specifying the stated features, integers, steps or components, but not precluding the presence of one or more other features, integers, steps or components, or group thereof.

Further aspects of the invention appear below in the detailed description of the invention.

BRIEF DESCRIPTION OF DRAWINGS

Embodiments of the invention will herein be illustrated by way of example only with reference to the accompanying drawings in which.

DETAILED DESCRIPTION

Figure 1:
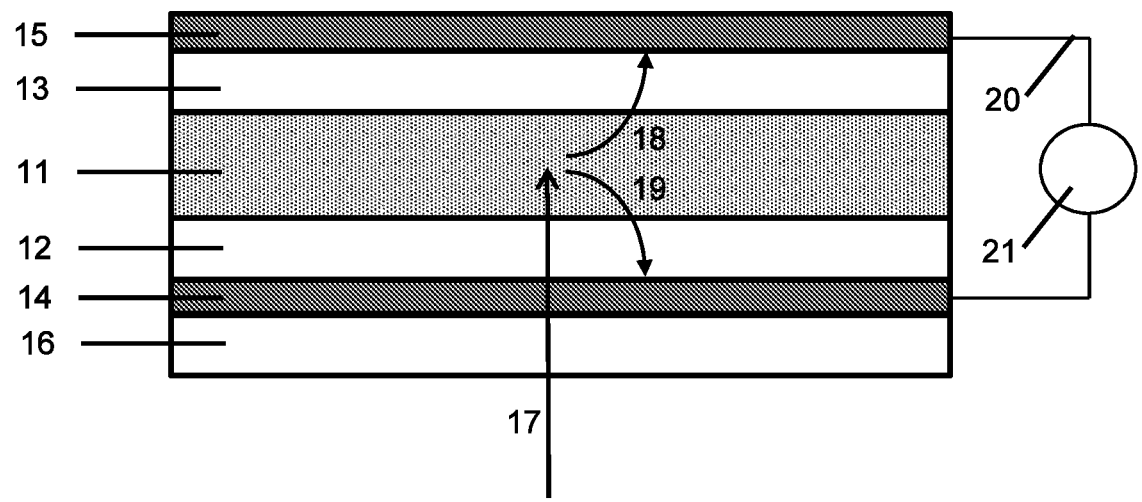
FIG. 1 schematically depicts a typical thin film solar cell architecture, including a perovskite film which may be produced according to the methods of the invention.

The present invention relates to methods of forming a perovskite film for an optoelectronic device. The methods generally include applying a perovskite precursor solution to at least one part of a hydrophilic region of a substrate, and drying the perovskite precursor solution to form a perovskite film on the hydrophilic region.

The perovskite precursor solution once applied spreads over the hydrophilic region, thus covering initially uncovered parts of the hydrophilic region. The spreading is driven by adhesive forces between the polar perovskite precursor solution and the hydrophilic surface, which are sufficiently strong to overcome cohesive forces within the solution acting to minimise its surface area. The hydrophilicity of the hydrophilic regions thus allows a thin, yet even, wet film to develop before drying produces crystallisation of the perovskite. This mode of forming a perovskite film may thus be distinguished from spin coating methods, where the solution is applied non-selectively on the substrate, high centrifugal forces cause the solution to flow across and off the edge of the spinning substrate and/or to dewet from selected regions on the substrate, and the solution is simultaneously and rapidly dried due to enhanced convection caused by the spinning.

The inventors have found that the spreading provides high quality perovskite films of satisfactorily consistent thickness. Such films, for example, have provided superior solar cell performance compared with films having similar perovskite loading and composition, but prepared by a slot-die coating methodology. Moreover, the methods may be particularly amenable to scale-up and process reproducibility since the configuration of the perovskite film is not dependent on the precision with which the precursor solution is applied to the substrate.

In preferred embodiments of the invention, the hydrophilic region of the substrate is bounded by a hydrophobic boundary, and the perovskite precursor solution is retained within the hydrophilic region along at least a portion of the hydrophobic boundary. The perovskite precursor solution is only applied to a part of the hydrophilic region, and then spreads over the substrate across initially uncovered areas until it reaches the hydrophobic boundary and is retained within the hydrophilic region by the hydrophobic boundary. Without wishing to be bound by any theory, it is believed that the retention of the solution in at least some embodiments is controlled by a repulsion of the polar precursor solution by the hydrophobic material of the boundary. The hydrophobic boundary advantageously allows perovskite films to be formed in a wide variety of arbitrary shapes on the substrate without precision placement of the precursor solution. Moreover, the thickness of the resultant perovskite film can be varied and controlled based only on the volumetric loading of the precursor solution, since the precursor solution will tend to fill the hydrophobically bounded hydrophilic region without spilling over the boundary.

In some preferred embodiments of the invention, the temperature of the precursor solution is elevated during at least the drying step. This may be achieved by heating the substrate before, during and/or after applying the precursor solution. Heating of the substrate is believed to assist the spreading of the solution across the hydrophilic region, and it may thus be advantageous to heat the substrate before applying the precursor solution. Moreover, in at least some embodiments the elevated temperature of the precursor solution during drying improves the crystalline morphology of the resultant perovskite film. In particular, the inventors have found that 2D perovskite film formation in the heated drying step produces a vertical, self-assembled orientation of the 2D perovskite crystalline slabs, i.e. perpendicularly to the substrate surface, which improves performance in solar cell applications.

Optoelectronic Devices

The disclosed methods are considered to be particularly useful for forming perovskite films for solar cells, and it will be convenient to discuss the invention further in the context of such devices. However, the invention is considered applicable to a wide range of other optoelectronic devices, including but not limited to light emitting diodes, photo diodes, transistors and memories.

The perovskite solar cell architecture generally includes a perovskite light-harvesting film sandwiched between hole transport (p-type) and electron transport (n-type) semiconductive layers. The perovskite has a band gap which is generally tuned to absorb a wide range of the visible light spectrum, and a diffusion distance sufficient to allow charge separation through the charge transport layers to adjacent conductive electrodes.

A typical thin film solar cell architecture is depicted in FIG. 1, including perovskite light-absorbing layer 11, hole transport layer 12, electron transport layer 13, conductive bottom electrode 14 and conductive back contact electrode 15. Optionally, the device is constructed by successively applying the functional layers to a substrate 16. Substrate 16, bottom electrode 14 and hole transport layer 12 are transparent such that, in use, the solar cell is configured for irradiation with light 17 which passes through transparent substrate 16 and layers 14 and 12 to be absorbed by perovskite film 11. Photovoltaically excited electrons 18 are then extracted via electron transport layer 13 to back contact electrode 15, while holes 19 are extracted via hole transport layer 12 to bottom electrode 14. The electrons travel through external circuit 20 for recombination with the holes at the cathode, and may thus be used to do electrical work in electrical device 21 of the circuit.

Alternatively, the device may be fabricated with transparent electron transport layer 12 and hole transport layer 13 (according to the numbering of FIG. 1). In this case, electrons 19 are extracted via electron transport layer 12 to bottom electrode 14, while holes 18 are extracted via hole transport layer 13 to back contact electrode 15.

Perovskite Precursor Solution

The invention comprises a step of applying a perovskite precursor solution to a hydrophilic region of a substrate. As used herein, a perovskite precursor solution is a solution comprising dissolved ionic components that crystallise to form a perovskite structure when the solution is concentrated, for example by drying. A wide range of such perovskite precursor solutions have previously been reported, and the invention is considered to be broadly applicable to the formation of perovskite films using these materials. Generally, it is preferred that the precursor solution contains each of the components substantially in the stoichiometry of the target perovskite structure, although it will be appreciated that perovskite structures may be formed using solutions which deviate significantly from this ideal.

The perovskite precursor solution comprises dissolved divalent metal cations (M), which may be $Pb^{2+}$ or $Sn^{2+}$, preferably $Pb^{2+}$. The perovskite precursor solution comprises inorganic anions (X), which may be halide ions such as $I^-$, $Br^-$ or $Cl^-$. It has been reported that the perovskite bandgap may be tuned via the relative proportion of halide ions, and the selection and ratio of halide ions in the solution may be selected accordingly. In some embodiments, the halide ions are predominantly, or exclusively, $I^-$. The perovskite precursor solution comprises monovalent organic cations, at least a portion of which are small organic cations (A) capable of incorporation in an $AMX_3$ perovskite unit structure, such as methylammonium (MA) or formamidinium (FA). In some embodiments, a portion of the organic cations are larger organic cations (R), such as phenylethylammonium (PEA), butylammonium (BA), isobutyl ammonium (iso-BA), pentyl ammonium (PentA) and propyl ammonium (PropA).

The precursor solution may be prepared by dissolving precursor salts in a solvent. The precursor salts typically consist of the component cations and anions, thus having the form $MX_2$, AX, and RX. The solvent is generally a polar solvent, since it must be capable of solubilising the component ions. Moreover, the solvent should be suitably volatile to allow drying of the solvent on a substrate and thus perovskite crystallisation. A suitable solvent is dimethylformamide (DMF). It will be appreciated that perovskite precursor solutions are inherently polar due to the polarity of the carrier solvent and the dissolved salt content.

The perovskite precursor solution is required to spread over the surface of the hydrophilic region once applied. Accordingly, the solution should have a suitable viscosity to allow this spreading. In some embodiments, the suitable viscosities are lower than typically desirable for coating or printing methods such as slot-die coating or gravure printing. The viscosity may be in the range of 0.6 to 600 mPa·s. In the case of lead perovskite precursor solutions in DMF, the inventors have found that suitable viscosities are provided at Pb concentrations of less than 0.7 mol/litre, such as less than 0.6 mol/litre, or less than 0.5 mol/litre, or about 0.3 mol/litre.

In some embodiments, the perovskite precursor solution is a 3D perovskite precursor solution. As used herein, a 3D perovskite precursor solution is one which, upon drying, produces a 3D perovskite crystalline structure.

In some embodiments, the perovskite precursor solution is a 2D perovskite precursor solution. As used herein, a 2D perovskite precursor solution is one which, upon drying, produces a 2D perovskite crystalline structure. The 2D perovskite precursor solution may produce a Ruddlesden-Popper 2D perovskite having the formula $R_2A_{n-1}M_nX_{3n+1}$; where $n=1\rightarrow\infty$. In some embodiments, n is less than or equal to about 5. In some embodiments, n is 4 or 5. In some embodiments, R is selected from one or more of BA, iso-BA, PEA, PentA and PropA. In some embodiments, A is MA, M is $Pb^{2+}$ and X is $I^-$. In some embodiments, the 2D perovskite has the formula $R_2A_3M_4X_{13}$, optionally wherein R is BA, A is MA, M is $Pb^{2+}$ and X is $I^-$. Such a precursor solution may be prepared by dissolving $PbI_2$, MAI and BAI at a molar ratio of 4:3:2 in a solvent such as dimethylformamide (DMF), for example at 70° C. for 1 h. In some embodiments, the 2D perovskite has the formula $R_2A_4M_5X_{16}$, optionally wherein R is selected from BA, iso-BA, PEA, PentA and PropA, A is MA, M is $Pb^{2+}$ and X is $I^-$.

The inventors have found that the methods of the invention are particularly advantageous for the preparation of 2D perovskite films. The substantially sequential process of spreading of the precursor solution under adhesion control, followed by crystallisation of the perovskites by drying, produces well-controlled 2D perovskite film thicknesses. Moreover, the opportunity to elevate the temperature during application and drying allows extremely well-oriented vertical 2D crystalline morphologies to be obtained. A further advantage is that the process may be conducted in air, i.e. without any control of humidity.

The perovskite precursor solution may comprise various additives which are reported to produce favourable perovskite performance in optoelectronic devices. For example, FA or caesium cations may be added. Additives such as $NH_4SCN$ and/or $NH_4Cl$ may also be included.

Substrate Including a Hydrophilic Region

The substrate comprises at least one hydrophilic region, to which the precursor solution is applied. As used herein, a hydrophilic region is a region of the substrate comprising a surface which is sufficiently hydrophilic that a perovskite precursor solution wets, and is able to spread across the surface, according to the principles disclosed here. One convenient way to quantify the hydrophilicity of a surface is via the water contact angle, for example as measured by placing a 2 µL droplet on a dried surface using a laboratory contact angle system (e.g. Dataphysics OCA 15EC). In some embodiments, the water contact angle of the hydrophilic region is less than 45°, such as less than 30°, or less than 20°, or less than 10°.

The entire substrate may consist of a hydrophilic material. In some embodiments, however, the substrate includes a surface layer formed of a hydrophilic composition, with the hydrophilic region then forming at least a portion of this surface layer. In the context of a solar cell as schematically in FIG. 1, or various other optoelectronic devices, the hydrophilic surface layer may be semiconductive layer 12, which may be either a hole transport layer or an electron transport layer depending on the configuration of the device.

In embodiments where the hydrophilic surface layer is a hole transport semiconductive layer, the hydrophilic composition of the layer may be poly(3,4-ethylenedioxythiophene) polystyrene sulfonate (PEDOT:PSS). PEDOT:PSS films are suitably hydrophilic: the inventors have determined that the water contact angle is 24-25° measured at 1 second after dropping, becoming less than 5° after 10 seconds and then stabilizing (the dynamic behavior is believed to be due to absorption of water into the PEDOT:PSS layer). Moreover, the transparency of PEDOT:PSS layers is particularly favourable for solar cell applications. Other suitable hole transport semiconductive layers may include other semiconductive conjugated polymers with ionic or polar side chains reported in the art, for example as disclosed in Journal of Colloid and Interface Science 2018, 26, 21-26, or inorganic hole transport layers such as $NiO_x$.

The hydrophilic surface layer may have a thickness of between about 20 nm and about 2000 nm, commonly less than 1000 nm. The layer may be deposited on the substrate by standard methods, including coating and printing methods. In some embodiments, as will be described in greater detail hereafter, the hydrophilic surface layer may be patterned onto the substrate so as to define the configuration of perovskite films subsequently produced by the methods of the invention. Printing techniques, for example screen-, inkjet- and gravure-print techniques, may thus be particularly preferred.

In some embodiments, the substrate comprising the hydrophilic region is a flexible substrate, which may be configured as a web suitable for roll-to-roll (R2R) fabrication techniques. Optionally, the hydrophilic surface layer and the perovskite precursor solution are sequentially applied to the web in an R2R production process.

Hydrophobic Boundary

In embodiments of the invention the hydrophilic region is bounded by a hydrophobic boundary. As used herein, a hydrophobic boundary is a region or line bordering the hydrophilic region and having a surface which is sufficiently hydrophobic, relative to the hydrophilic region, that a perovskite precursor solution adjacent the boundary, for example as result of spreading across the hydrophilic region and reaching the boundary, is selectively retained within the hydrophilic region according to the principles disclosed herein.

In some embodiments, the substrate itself has a hydrophobic surface, and the hydrophilic region is formed of a hydrophilic composition selectively located on the hydrophobic surface. In such cases, the hydrophobic surface adjacent to the hydrophilic region may provide the hydrophobic boundary.

Figure 2:
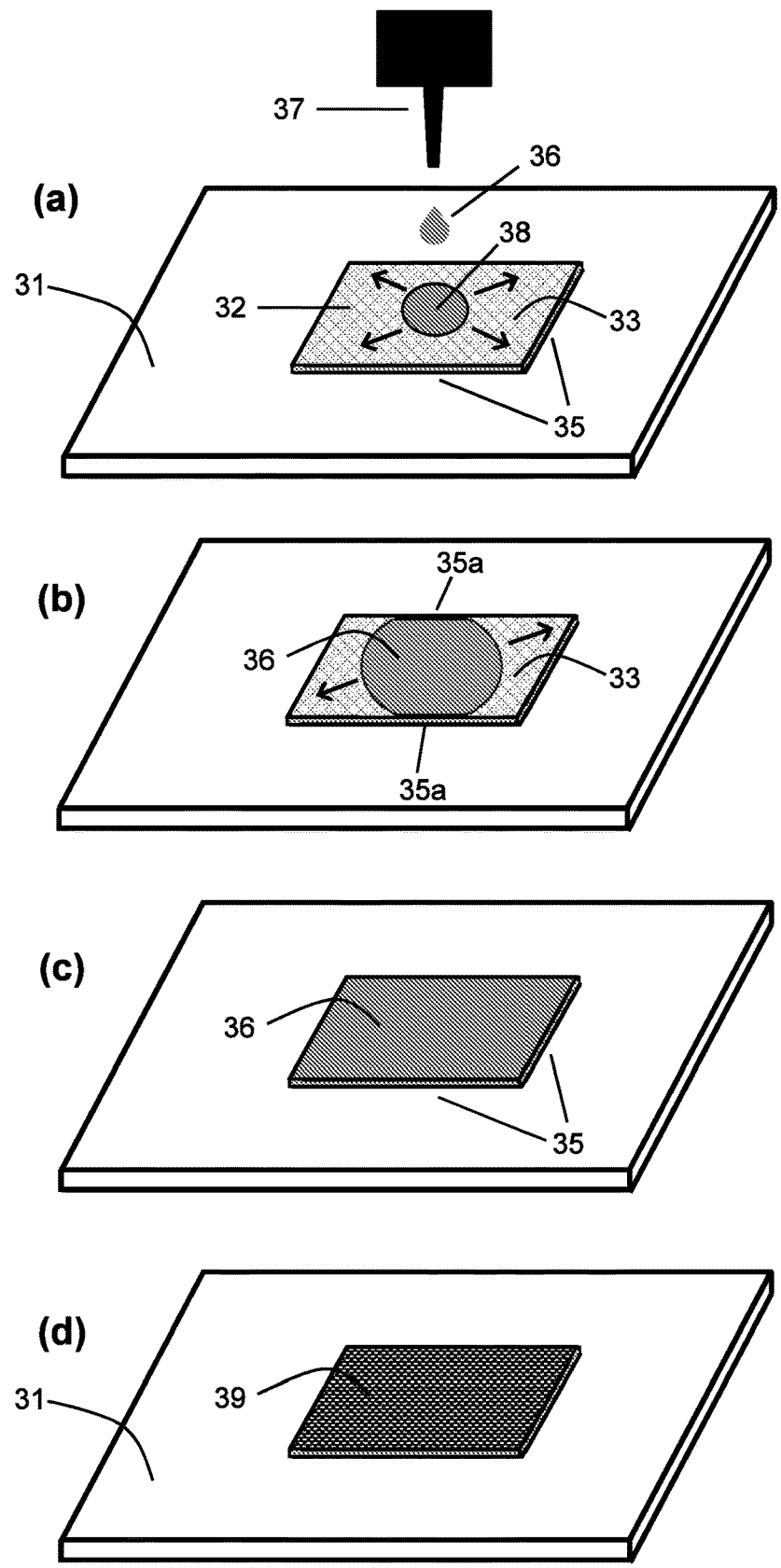
FIG. 2 schematically depicts a method of forming a perovskite film according to an embodiment of the invention.

Referring to FIG. 2, for example, the surface of substrate 31 is hydrophobic. Hydrophilic layer 32, for example a PEDOT:PSS coating with a thickness of about 30 nm, is formed on substrate 31 in the form of a rectangle, thus defining a rectangular hydrophilic region 33 on the substrate. Adjacent areas of substrate 31 define rectangular hydrophobic boundary 35 around the hydrophilic region.

It will be appreciated that the hydrophilic layer may be provided in any desirable shape, including geometrical shapes, indicia, and patterns. Moreover, it is not required that the hydrophobic boundary provided by the adjacent hydrophobic substrate surface completely encloses the hydrophilic region. For example, elongated strips of the hydrophilic layer may be produced across the width or length of the substrate, such that the hydrophilic region is hydrophobically bounded only on two sides.

The hydrophilic layer may be selectively formed on the substrate by known methods, such as coating or printing techniques, for example screen-, inkjet- and gravure-print techniques. It is also envisaged that a hydrophilic composition may be selectively located on a hydrophobic surface by means other than applying a discrete surface layer. For example, a hydrophilic composition may be selectively permeated into a porous surface of the hydrophobic substrate, or an area of the substrate may be selectively surface-modified to convert the hydrophobic surface into a hydrophilic composition. In another variation, areas or lines of a continuous hydrophilic surface layer may be selectively removed, for example by abrasion, ablation or etching, to expose the underlying hydrophobic substrate, thereby producing the hydrophobic boundary.

The hydrophobic surface of the substrate may have a water contact angle of greater than 50°, such as greater than 60°. The hydrophobic surface may be selected from the group consisting of polymer surfaces and metallic surfaces. One suitable hydrophobic substrate is polyethylene terephthalate (PET), which may be used as a web substrate in R2R production processes.

In some embodiments, the substrate has a hydrophilic surface, which may optionally be provided by a hydrophilic surface layer as disclosed herein. A hydrophobic composition is then selectively located on the hydrophilic surface to provide the hydrophobic boundary for a specific hydrophilic region on the more extensive hydrophilic substrate surface.

Figure 3:
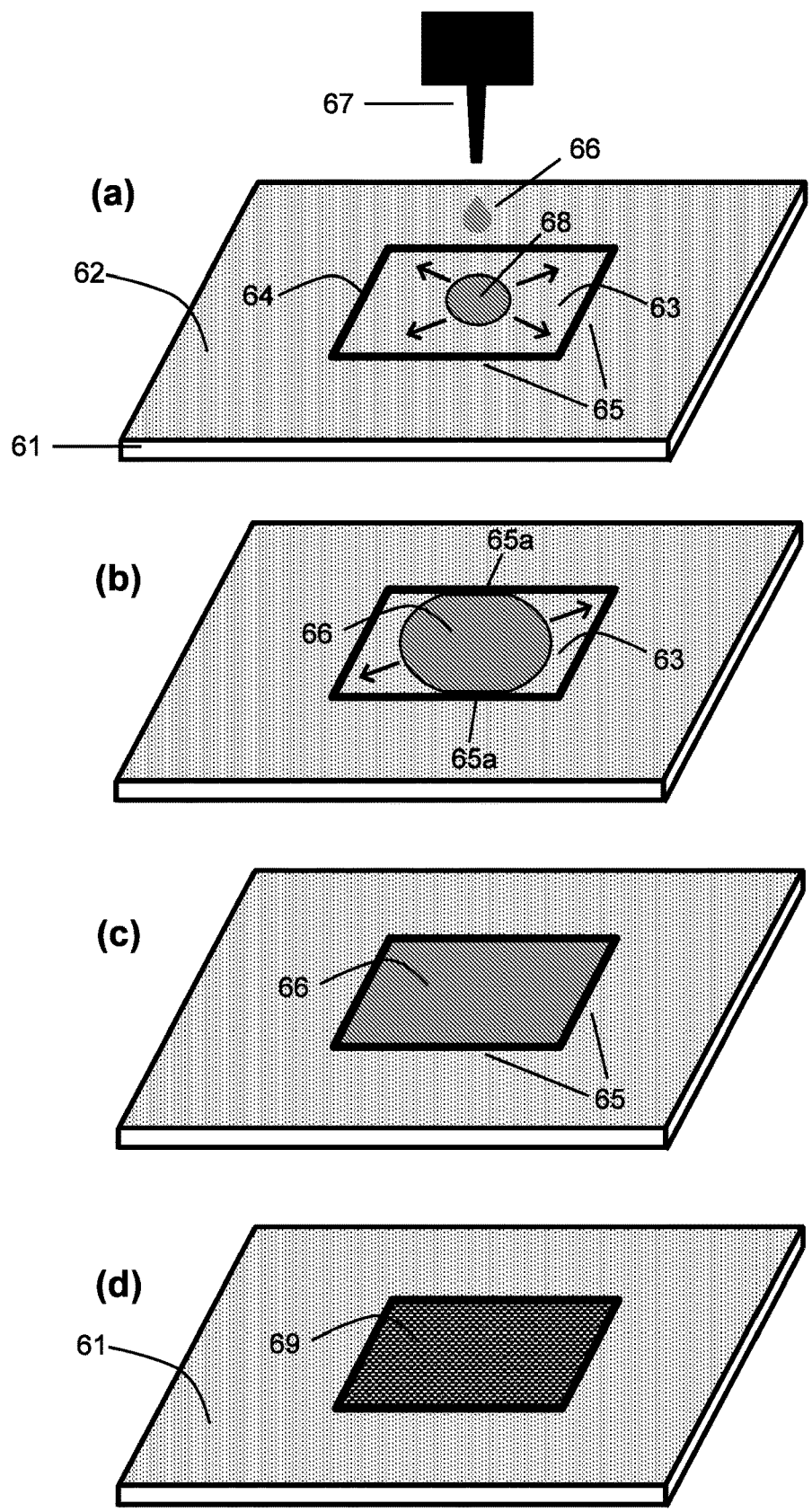
FIG. 3 schematically depicts a method of forming a perovskite film according to another embodiment of the invention.

Referring to FIG. 3, for example, the surface of substrate 61 is hydrophilic due to the presence of hydrophilic surface layer 62. Hydrophilic layer 62, for example a PEDOT:PSS coating with a thickness of about 30 nm, may be coated onto substrate 61 via known techniques. Hydrophobic composition 64 is then applied in lines which form a rectangle on the surface of hydrophilic layer 62. Rectangular hydrophobic boundary 65, formed from composition 64, thus defines a rectangular hydrophilic region 63 on the substrate.

The hydrophobic boundary may define any desirable shape of the hydrophilic region, including geometrical shapes, indicia, and patterns. The line width of the hydrophobic boundary is not considered to be particularly limited, provided that sufficient hydrophobic composition is provided to retain the perovskite precursor solution. In some embodiments, the line width is less than 5 mm, or less than 1 mm, or less than 0.5 mm. The hydrophobic boundary does not necessarily fully enclose the hydrophilic region. For example, an elongated hydrophilic region on the hydrophilic substrate surface may be bounded on only two sides by lines of hydrophobic composition. Moreover, it is envisaged that the hydrophobic boundary may be non-continuous, for example a line of dots of hydrophobic composition along the edge of a target hydrophilic region. It will thus be appreciated that the configuration of the hydrophobic boundary is not limited beyond the requirement that it is capable of retaining a perovskite precursor solution according to the principles disclosed herein.

The hydrophobic composition forming the boundary may form a surface layer or elevated line above the hydrophilic surface, or it may permeate into a porous surface of the hydrophilic substrate. It is also envisaged that a hydrophobic boundary may be produced on the hydrophilic substrate by selective surface-modification to convert parts of the hydrophilic surface into a hydrophobic composition.

The hydrophobic composition may be applied by known techniques including coating, printing and line application from a nozzle or needle. The hydrophobic composition may be applied in an ink formulation together with a volatile carrier fluid that evaporates once applied.

The hydrophobic composition may generally comprise any suitable hydrophobic materials, including hydrophobic polymers, waxes, organic small molecules, metals and metal oxides. An example of a suitable material is a hydrophobic poly(triarylamine) (PTAA) polymer such as poly[bis(4-phenyl)(2,4,6-trimethylphenyl)amine. In some embodiments, the hydrophobic composition has a water contact angle of greater than 50°, such as greater than 60°, or greater than 90°. The hydrophobic composition may be chosen to be present in the hydrophobic boundary as a substantially solidified and involatile composition. However, it is not excluded that the hydrophobic composition may be a liquid, for example a viscous liquid. Moreover, the hydrophobic composition may be volatile, provided that it remains on the hydrophilic substrate for long enough to retain the perovskite precursor solution in the methods of the invention.

As already disclosed herein, the hydrophobic boundary may comprise a line of hydrophobic composition formed on the hydrophilic surface of the substrate. This line may thus define the hydrophobic boundary for adjacent hydrophilic regions where perovskite precursor solution is also to be applied. In this way, proximate yet unconnected perovskite films may be prepared on the hydrophilic substrate.

Applying, Spreading and Shaping the Perovskite Precursor Solution

The methods of the invention include a step of applying a perovskite precursor solution to at least one part of a hydrophilic region of a substrate, such that the perovskite precursor solution then spreads over the hydrophilic region.

In some embodiments, at least the hydrophilic region of the substrate is heated before, during and/or after applying the precursor solution. Heating the substrate before or during the application may advantageously assist the solution to spread over the hydrophilic region. Moreover, the heating may advantageously increase the temperature of the precursor solution during the drying step, as will be described in greater detail hereafter. The substrate may be heated to a temperature of at least 30° C., such as in the range of 40° C. to 80° C.

Since the invention does not rely on a high precision placement of the perovskite precursor solution on the hydrophilic region of the substrate, a wide range of application methods may be employed. For example, the perovskite precursor solution may suitably be drop cast, or applied as a line, onto the hydrophilic region depending on its configuration. Single-location drop casting may be particularly suited to smaller enclosed hydrophilic regions, whereas a line may be more suited to an elongated hydrophilic region. Coating or printing techniques may also be used.

The solution may be applied to any sized part or parts of the hydrophilic region. The perovskite precursor solution may optionally be applied separately to more than one part of the hydrophilic region and allowed to coalesce during the spreading; this may be preferred for larger surface area regions. The substrate will typically be substantially horizontal when the perovskite precursor is applied, such that the solution is able to spread across the hydrophilic region and form an evenly distributed wet film.

Given that some methods of the invention shape the resultant perovskite films by allowing spreading of the precursor solution until repulsion by a hydrophobic boundary, it is preferred that the precursor solution is selectively applied to the hydrophilic region (or regions) on the substrate. Thus, in some embodiments, the precursor solution is not applied onto or over the hydrophobic boundary or other hydrophilic regions on the substrate. However, it will be appreciated that selective application of the precursor solution to a part of the hydrophilic region encompasses applications both remote from and immediately adjacent to a hydrophobic boundary bounding the hydrophilic region, provided that the solution may then spread over the hydrophilic region and be retained by the hydrophobic boundary according to the principles disclosed herein.

Optionally, the perovskite precursor solution may be applied in a R2R process. The substrate may thus be fed in the form of a web beneath an applicator, which applies the perovskite precursor solution to the hydrophilic region of the substrate as it is fed past the applicator. The web may be heated in-line, for example against a hot backing plate, before, during and/or after the application.

Once applied to one or more parts of the hydrophilic region, the perovskite precursor solution spreads across the hydrophilic region of the substrate. The solution spreads in response to the adhesive forces between the polar perovskite precursor solution and the surface of the hydrophilic region, with gravity potentially contributing as well. However, the spreading does not rely on centrifugal forces. In embodiments of the invention, therefore, the hydrophilic region is not spun, or rotated at all, during the application or spreading of the precursor solution.

In embodiments of the invention, as previously disclosed herein, the hydrophilic region is bounded by a hydrophobic boundary. Once applied, the perovskite precursor solution spreads over the hydrophilic region until it encounters the hydrophobic boundary. The solution is then retained within the hydrophilic region by at least a portion of the hydrophobic boundary.

The solution may be retained along substantially the entire hydrophobic boundary. This may be preferred, for example, when the hydrophobic boundary fully encloses the hydrophilic region. To achieve this, a volume of perovskite precursor solution sufficient to cover the entire hydrophilic region should be applied.

An advantage of the invention is that the thickness of the perovskite film can be varied and controlled based only on the volumetric loading of the precursor solution. This is because different volumes of precursor solution can be selectively retained on similarly dimensioned, hydrophobically bounded hydrophilic regions. Moreover, both the surface area of the target hydrophilic region and the perovskite component concentrations are typically known. Thus, the perovskite film thickness can be accurately controlled by selecting the applied volume of precursor solution. It will be apparent that such control is only apparent within a range of thicknesses, since the application of excessive volumes of precursor solution may result in undesirable overflow across the hydrophobic boundary.

Figure 18:
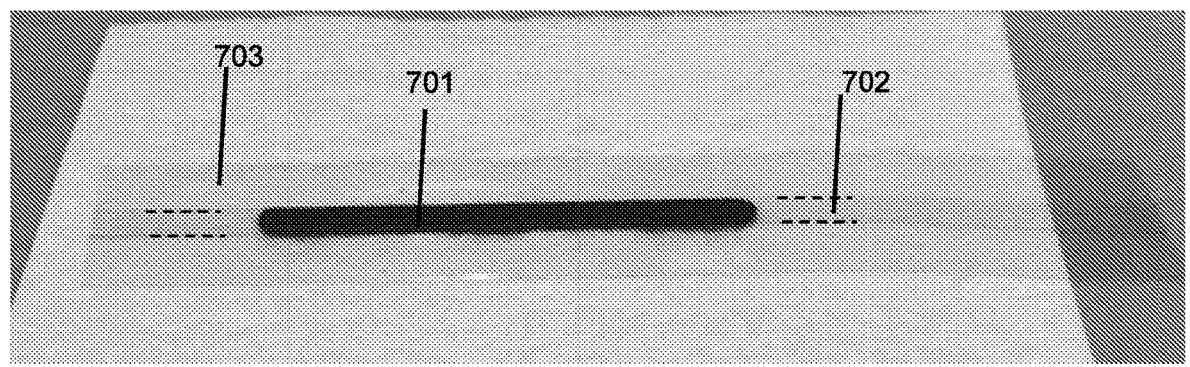
FIG. 18 a photograph of a perovskite film in the form of an elongated strip, produced in Example 9 according to another embodiment of the invention.

In some embodiments, the solution is retained along only a portion of the hydrophobic boundary. For example, when an elongated hydrophilic region is bounded by two parallel hydrophobic boundaries, a line of perovskite precursor solution applied along the middle of the region will spread outwardly until it encounters and is retained by the two hydrophobic boundaries. It is not necessary to fill the entire hydrophilic region to produce a well-structured elongated strip of perovskite film having parallel edges, for example as depicted in FIG. 18.

In some embodiments, adjacent hydrophilic regions of the substrate are separated by a common hydrophobic boundary. As disclosed herein, this shared boundary may be a line of hydrophobic composition formed across the hydrophilic surface of a substrate. Alternatively, layers of a hydrophilic composition may be selectively located in close proximity on a hydrophobic substrate, with an intermediate line of the underlying hydrophobic substrate functioning as the shared hydrophobic boundary. An advantage of the invention is that closely located yet unconnected perovskite films may be prepared in this manner, since the shared hydrophobic boundary acts to prevent coalescence of the precursor solution applied in each hydrophilic region. By contrast, closely positioned printed features not separated by a boundary are susceptible to coalescence, particularly on hydrophilic substrates. The inventors believe that the methods of the invention may be used to prepare discrete perovskite films with a separation of less than 1 mm, or less than 0.5 mm.

The methods of the invention are thus suited to the preparation of multiple similarly or differently configured perovskite films on the surface of the substrate, since the perovskite precursor solution may be separately applied to each of the hydrophilic regions on the substrate. In this way, a wide range of perovskite film patterns and shapes can be produced, for functional and/or aesthetic reasons.

Drying the Precursor Solution

The methods of the invention include a step of drying the perovskite precursor solution to form a perovskite film on the hydrophilic region of the substrate. While drying will typically commence immediately after the precursor solution is applied, the drying rate is generally controlled such that perovskite crystallisation does not commence until the solution has spread to the full extent required in the hydrophilic region.

In some embodiments, the temperature of the perovskite precursor solution on the hydrophilic region is elevated when drying the solution to form the perovskite film. The solution may be heated indirectly, i.e. by heating the substrate. The temperature during drying provides the primary control for the rate of evaporation of the solvent, and it will be appreciated that the preferred temperature may depend on the nature of the perovskite precursor solution and in particular the solvent. In some embodiments, the temperature of the precursor solution during the drying is at least 30° C., such as in the range of 40° C. to 80° C., or about 45° C. to about 65° C.

In the case of 2D perovskite precursor solutions, the inventors have found that drying temperatures in this range provide excellent vertical alignment of the 2D crystalline perovskite structure, thereby improving the performance in solar cell applications. Moreover, an appropriate balance between the rate of spreading and the rate of drying is provided, for example when DMF is used as the solvent.

Once the perovskite film has crystallised, the film may be subjected to further processing steps, including higher temperature annealing steps to remove remaining solvent.

EMBODIMENTS

An embodiment of the invention will now be described with reference to FIG. 2. As described herein, hydrophilic layer 32 (for example a printed PEDOT:PSS coating of approximately 30 nm thickness) is selectively located on hydrophobic substrate 31 (for example a PET film). The surface of hydrophilic layer 32 thus provides rectangular hydrophilic region 33, which is bounded by hydrophobic boundary 35 formed by adjacent areas of substrate 31.

Substrate 31 is heated to a temperature of about 60° C. to 70° C., for example by a heated backing plate (not shown). As seen in FIG. 2(a), perovskite precursor solution 36 is then drop-cast from applicator 37 (for example a needle) onto central part 38 of hydrophilic region 33. Perovskite precursor solution 36 may be a 2D perovskite precursor solution, for example a solution of $PbI_2$, MAI and BAI at a molar ratio of 4:3:2 in DMF, with a Pb concentration of about 0.3 mol/litre. As a result of the hydrophilicity of hydrophilic region 33, the precursor solution spreads isotropically in an outward direction, following Fick's first law, as a thin wet film.

As seen in FIG. 2(*b*), perovskite precursor solution 36 spreads until it reaches hydrophobic boundary 35, where it is retained within hydrophilic region 33 by boundary portions 35*a* while continuing to spread across hydrophilic region 33. Eventually, as seen in FIG. 2(*c*), precursor solution 36 covers the entire hydrophilic region 33 and is retained along the entire hydrophobic boundary 35. Optionally, further volumes of precursor solution 36 are added before or after hydrophilic region 36 is entirely covered, to ensure that a sufficient total volume is added to cover the hydrophilic region and to achieve a target perovskite film thickness.

As a result of the heating of substrate 31, the wet film of perovskite precursor solution 36 is dried at an elevated temperature, for example above 50° C. but below 70° C. This elevated temperature promotes the drying while still allowing precursor solution 36 to spread fully before perovskite crystallisation is initiated. Once the concentration of the perovskite solution reaches the crystallisation point during drying, perovskite crystallisation initiates, typically from the edges of the wet film, until the entire wet film crystallises. As seen in FIG. 2(*d*), perovskite film 39 is thus formed selectively on substrate 31 in the rectangular shape defined by hydrophilic region 33 and hydrophobic boundary 35. A favourable vertical (i.e. out-of-plane) orientation of 2D perovskite crystals in film 39 is also obtained as a result of the elevated temperature of drying. Once crystallised, the film may then be subjected to further drying and heating, including higher temperature annealing (for example at about 100° C.) to produce the final perovskite film suitable for the optoelectronic device.

Another embodiment of the invention will now be described with reference to FIG. 3. As described herein, hydrophilic surface layer 62 (for example a PEDOT:PSS coating of approximately 30 nm thickness) is provided over the surface of substrate 61. Rectangular hydrophobic boundary 65, formed by lines of hydrophobic composition 64 (for example PTAA) applied to hydrophilic surface layer 62, defines a hydrophobic boundary around rectangular hydrophilic region 63 of the surface layer.

Substrate 61 is heated to a temperature of about 60° C. to 70° C., for example by a heated backing plate (not shown). As seen in FIG. 3(*a*), perovskite precursor solution 66 is then drop-cast from applicator 67 (for example a needle) onto central part 68 of hydrophilic region 63. Perovskite precursor solution 66 may be a 2D perovskite precursor solution similar to solution 36, or alternatively another precursor solution such as a 3D perovskite precursor solution. As a result of the hydrophilicity of hydrophilic region 63, precursor solution 66 spreads isotropically in an outward direction, following Fick's first law, as a thin wet film.

As seen in FIG. 3(*b*), perovskite precursor solution 66 spreads until it reaches hydrophobic boundary 65, where it is retained within hydrophilic region 63 by boundary portions 65*a* while continuing to spread across hydrophilic region 63. Eventually, as seen in FIG. 3(*c*), precursor solution 66 covers the entire hydrophilic region 63 and is retained along the entire hydrophobic boundary 65.

As a result of the heating of substrate 61, the wet film of perovskite precursor solution 66 is dried at an elevated temperature, suitable to promote drying while still allowing precursor solution 66 to spread fully before perovskite crystallisation is initiated. Drying of the precursor solution then initiates perovskite crystallisation, with the elevated temperature also producing a favourable orientation of the resultant perovskite crystals. As seen in FIG. 3(*d*), perovskite film 69 is thus formed selectively on substrate 61 in the rectangular shape defined by hydrophilic region 63 and hydrophobic boundary 65.

Figure 4:
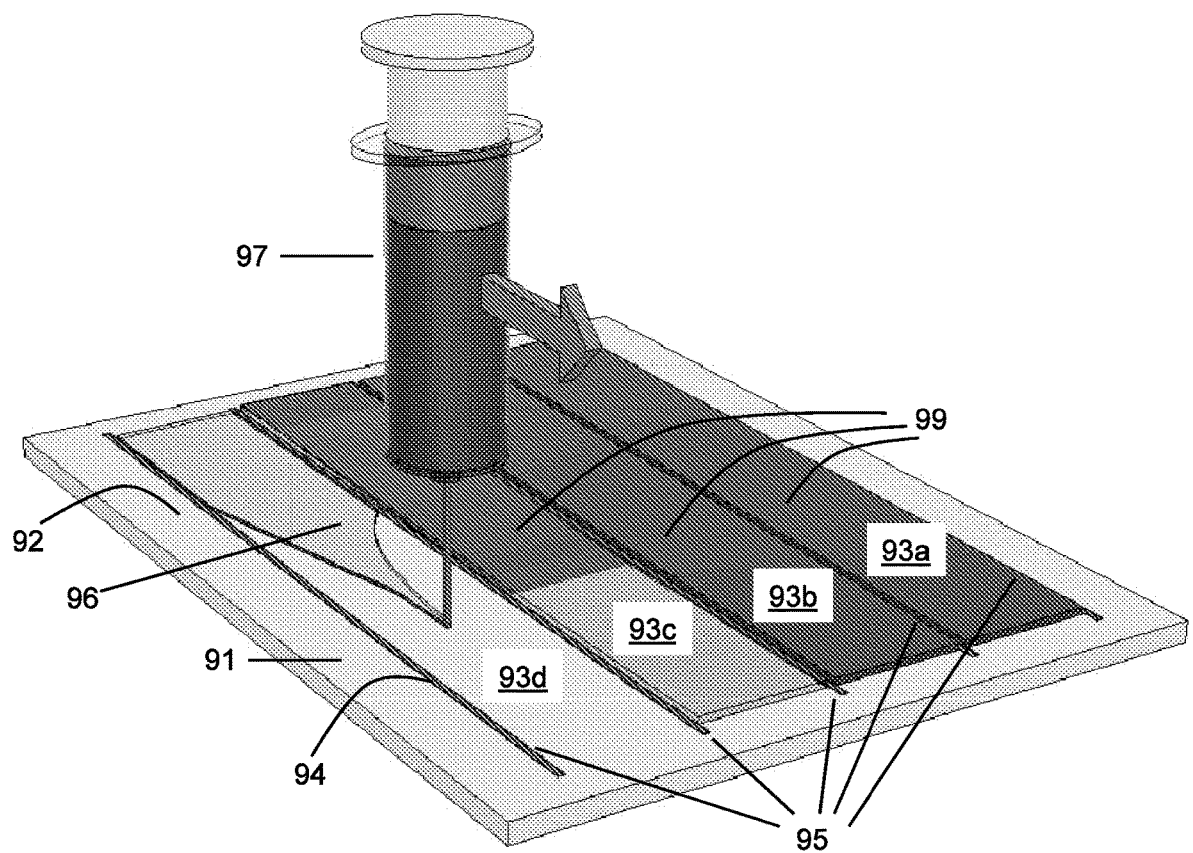
FIG. 4 schematically depicts a method of forming a perovskite film according to another embodiment of the invention.

Another embodiment of the invention will now be described with reference to FIG. 4. Substrate 91 has hydrophilic surface 92 (which may for example be a PEDOT:PSS surface coating of approximately 30 nm thickness). Parallel lines of hydrophobic composition 94, with a width of less than 1 mm, are present on hydrophilic surface 92. Elongated hydrophobic regions 93*a*-93*d* are thus defined on substrate surface 92, with the lines forming hydrophobic boundaries 65 bounding the hydrophilic regions on two sides. Hydrophilic regions 93*a* and 93*b* are thus adjacent but separated by a common hydrophobic boundary 95, and similarly also for hydrophilic regions 93*b* and 93*c*, and hydrophilic regions 93*c* and 93*d*.

Substrate 91 is heated to a temperature of about 60° C. to 70° C., for example by a heated backing plate (not shown). Perovskite precursor solution 96 is then applied as a line along the centre of the hydrophilic regions 93 by applicator 97 (moving in the direction shown by the arrow). As depicted in FIG. 4, precursor solution 96 has already been applied to hydrophilic regions 93*a*, 93*b* and 93*c*, and is being applied to hydrophilic region 93*d*. Perovskite precursor solution 96 may be a 2D perovskite precursor solution similar to solution 36, or alternatively another precursor solution such as a 3D perovskite precursor solution.

As seen for hydrophilic region 93*d*, precursor solution 96 spreads outwardly after application as a thin wet film until it reaches hydrophobic line boundaries 95, where it is retained within the hydrophilic region by the boundaries. Eventually, as seen for hydrophilic regions 93*a*, 93*b* and 93*c*, precursor solution 96 covers the full width of the hydrophilic regions and is retained along the full length of hydrophobic boundaries 65 adjacent to which the precursor solution was applied. Despite the close proximity of the adjacent hydrophilic regions 93, the precursor solution 96 in adjacent regions does not coalesce due to the shared hydrophobic boundary 95. Moreover, the thickness of the wet film covering the hydrophilic regions may be controlled via the volumetric dispensing rate from applicator 97 and/or the line drawing speed.

As a result of the heating of substrate 91, the wet film of perovskite precursor solution 96 in each hydrophilic region is dried at an elevated temperature. After the solution has spread to the full extent required, the drying induces crystallisation from solution 96 to form perovskite film 99, as seen in hydrophilic region 93*c* in FIG. 4. Closely positioned, yet unconnected perovskite films 99 are thus formed selectively on substrate 91.

Systems

The present invention also relates to systems for performing the methods of the invention. The systems generally include a substrate comprising a hydrophilic region as disclosed herein, and an applicator for applying a perovskite precursor solution to at least a part of the hydrophilic region. The perovskite precursor solution once applied will spread over the hydrophilic region according to the principles disclosed herein. In embodiments of the invention, the hydrophilic region of the substrate is bounded by a hydrophobic boundary as disclosed herein. Thus, the solution once applied will be retained within the hydrophilic region along at least a portion of the hydrophobic boundary.

The system may be configured to form the perovskite film in a roll-to-roll process. Thus, the system may further comprise a feeder configured to feed the substrate in the form of a web beneath the applicator. The feeder may be configured to unwind the web from a feed roll, feed it horizontally for a sufficient distance to allow application, spreading and drying, for example across a backing plate, and onward to a rewind roll. The applicator may then be positioned above the horizontal web portion, and configured to apply the perovskite precursor solution to the hydrophilic region of the substrate as the web is fed past the applicator. It will be appreciated that the web may be stationary or moving while the precursor solution is applied, and that the applicator itself may be stationary or moving during the application, depending on the target size and geometry of the perovskite films to be formed.

The applicator may be configured to drop the perovskite precursor solution onto the hydrophilic region, or to apply a line of the perovskite precursor solution to the hydrophilic region. The system may further comprise a reservoir containing the perovskite precursor solution for application via the applicator.

The system may comprise a heater configured to heat the substrate to a temperature of at least 30° C., such as a temperature in the range of 40° C. to 80° C. The heater may be a heated surface, such as the backing plate, configured to contact the substrate before, during and/or after the precursor solution is applied.

The system, for example when configured for roll-to-roll manufacture, may be configured also to produce the hydrophilic region and/or the hydrophobic boundary on the substrate prior to the application of the perovskite precursor solution, according to the principles disclosed herein. Moreover, the system may be configured to apply additional layers to the substrate after forming the perovskite film. Thus, it is envisaged that a solar cell, for example having the architecture depicted in FIG. 1, may be produced on a transparent web substrate in a roll-to-roll manufacturing process.

EXAMPLES

The present invention is described with reference to the following examples. It is to be understood that the examples are illustrative of and not limiting to the invention described herein.

Materials $PbI_2$ was obtained from Alfa Aesar. Methyl ammonium iodide (MAI) and butyl ammonium iodide (BAI) were obtained from Greatcell Solar. Anhydrous solvents were obtained from commercial laboratory suppliers, including Sigma-Aldrich. Patterned Indium Tin Oxide (ITO) glass was obtained from Shenzheng Display Photoelectric Materials Co. Ltd., China. PEDOT:PSS dispersion (Baytron P AI 4083) was obtained from HC Starck. [6,6]-Phenyl $C_{61}$ butyric acid methyl ester ($PC_{61}BM$) was obtained from Nano-C. Polyethylenimine ethoxylated (PEIE) was obtained from Aldrich, 80% ethoxylated solution.

Materials Characterization

Optical transmission mapping was performed using an Epson Perfection V700 Photo-scanner. UV-visible absorption spectra were recorded using a Lambda 35 Perkin-Elmer absorption spectrometer. Photoluminescence (PL) spectra were recorded using a fluorescence spectrophotometer (LS55, Perkin-Elmer). XRD was performed using a Rigaku SmartLab with Cu Kα radiation. Atomic Force Microscopy (AFM) was performed using a Veeco Dimension 3100 microscope (tapping mode). The cross-section of the film was measured by using a dual beam focused ion beam scanning electron microscopy (FIB-SEM) system. Film thicknesses were measured by using a Dektak profilometer. Water contact angles were measured using a contact angle system (Dataphysics OCA 15EC), placing a 2 µL droplet on a dried surface. For each surface, 10 repeat measurements were performed.

Solar Cell Performance Testing

J-V curves were measured under an inert atmosphere using a Keithley 2400 Source Meter under standard solar irradiation (AM 1.5G, 100 mW $cm^{-2}$). The light intensity was calibrated using a reference cell (Hamamatsu S1133 with KG5 filter, 2.8×2.4 mm of photosensitive area), which was calibrated by a certified reference cell (PV Measurements, certified by NREL) under 1000 W $m^{-2}$ AM 1.5G illumination from an Oriel AAA solar simulator fitted with a 1000 W Xe lamp.

The External Quantum Efficiency (EQE) spectrum was collected using bespoke equipment in an ambient atmosphere. The light source (Oriel 150 W Xe lamp) was chopped at 27 Hz and the electrical signal was collected under short circuit conditions using a low noise current pre-amplifier (SR570, Stanford Research Systems) and lock-in amplifier (SR830 DSP, Stanford Research Systems). A standard, filtered Si cell from Peccell Limited, which was cross-calibrated with a standard reference cell traceable to the NREL, was used as the reference.

Example 1. Preparation of Perovskite Precursor Solutions 2D perovskite $(BA)_2(MA)_3Pb_4I_{13}$ precursor solutions were prepared by stirring $PbI_2$, MAI and BAI at a molar ratio of 4:3:2 in dimethylformamide (DMF) at 70° C. for 1 h. Solutions with $Pb^{2+}$ concentrations of 0.9 mol $L^{-1}$, 0.7 mol $L^{-1}$, 0.5 mol $L^{-1}$, 0.3 mol $L^{-1}$, and 0.2 mol $L^{-1}$ were prepared in this manner.

2D perovskite $(iso-BA)_2(MA)_4Pb_5I_{16}$ precursor solution was prepared by stirring $PbI_2$, MAI and iso-butyl ammonium iodide (iso-BAI) at a molar ratio of 5:4:2 in dimethylformamide (DMF) at 70° C. for 1 h. A solution with $Pb^{2+}$ concentration of 0.3 mol $L^{-1}$ was prepared in this manner.

2D perovskite $(BA)_2(MA)_4Pb_5I_{16}$ precursor solutions were prepared by stirring $PbI_2$, MAI and BAI at a molar ratio of 5:4:2 in dimethylformamide (DMF) at 70° C. for 1 h. A solution with $Pb^{2+}$ concentration of 0.3 mol $L^{-1}$ was prepared in this manner.

2D perovskite $(PEA)_2(MA)_4Pb_5I_{16}$ precursor solutions were prepared by stirring $PbI_2$, MAI and phenylethyl ammonium iodide (PEAI) at a molar ratio of 5:4:2 in dimethylformamide (DMF) at 70° C. for 1 h. A solution with $Pb^{2+}$ concentration of 0.3 mol $L^{-1}$ was prepared in this manner.

2D perovskite $(Pentyl\ ammonium)_2(MA)_4Pb_5I_{16}$ precursor solutions were prepared by stirring $PbI_2$, MAI and Pentyl ammonium iodide at a molar ratio of 5:4:2 in dimethylformamide (DMF) at 70° C. for 1 h. A solution with $Pb^{2+}$ concentration of 0.3 mol $L^{-1}$ was prepared in this manner.

2D perovskite $(Propyl\ ammonium)_2(MA)_4Pb_5I_{16}$ precursor solutions were prepared by stirring $PbI_2$, MAI and propyl ammonium iodide at a molar ratio of 5:4:2 in dimethylformamide (DMF) at 70° C. for 1 h. A solution with $Pb^{2+}$ concentration of 0.3 mol $L^{-1}$ was prepared in this manner.

Example 2. Preparation of Shaped 2D Perovskite Films on a Glass Substrate

A laboratory syringe needle with size of 21G×1¼ was used to draw lines of a fluid composition onto the surface of an ITO-glass substrate, using an auto-pump to control the flow rate. The needle thus deposited a line of ink comprising the hydrophobic poly(triarylamine) (PTAA) polymer poly [bis(4-phenyl)(2,4,6-trimethylphenyl)amine on the substrate. The glass substrate had a hydrophilic surface characterized by a water contact angle of 36°±1.7. The water contact angle of PTAA is over 90° (c.a. 105° reported in Nat Commun. 2015, 6, 7747). By drawing boundary lines on the hydrophilic substrate surface with the hydrophobic ink, shaped regions of the surface could be selectively covered with the perovskite precursor solution via the following method.

The substrate was placed on a hot plate in air and heated to 50° C. The $(BA)_2(MA)_3Pb_4I_{13}$ precursor solution with $Pb^{2+}$ concentration of 0.3 mol $L^{-1}$ was then drop cast (in less than 1 second) onto the hydrophilic substrate surface in the target region and allowed to flow isotropically across the substrate surface. The polar precursor solution wetted the hydrophilic ITO surface and thus spread as a thin film across the surface. Once the liquid precursor solution reached the boundary line, however, it was repelled by the hydrophobic ink and thus retained within the shaped region of the glass substrate. The volume of the precursor solution was sufficient to result in complete filling of the shaped region while retaining all of the applied solution within the boundary lines.

Within less than a minute of drying on the hot plate, the clear yellow wet film began to transform into a brown solid, indicating perovskite crystal formation. A uniform perovskite film was formed across the entire shaped region after about 70 seconds (for a 50 mm×50 mm substrate; smaller areas took less time).

Figure 5:
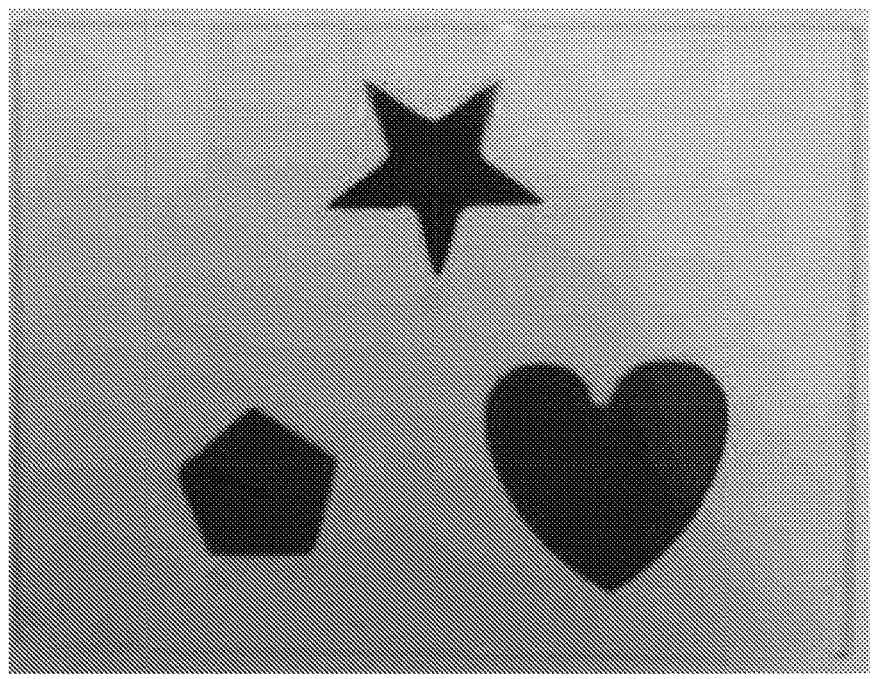
FIG. 5 is a photograph of perovskite films in the shape of a star, a pentagon and a heart, produced in Example 2 according to an embodiment of the invention.
Figure 6:
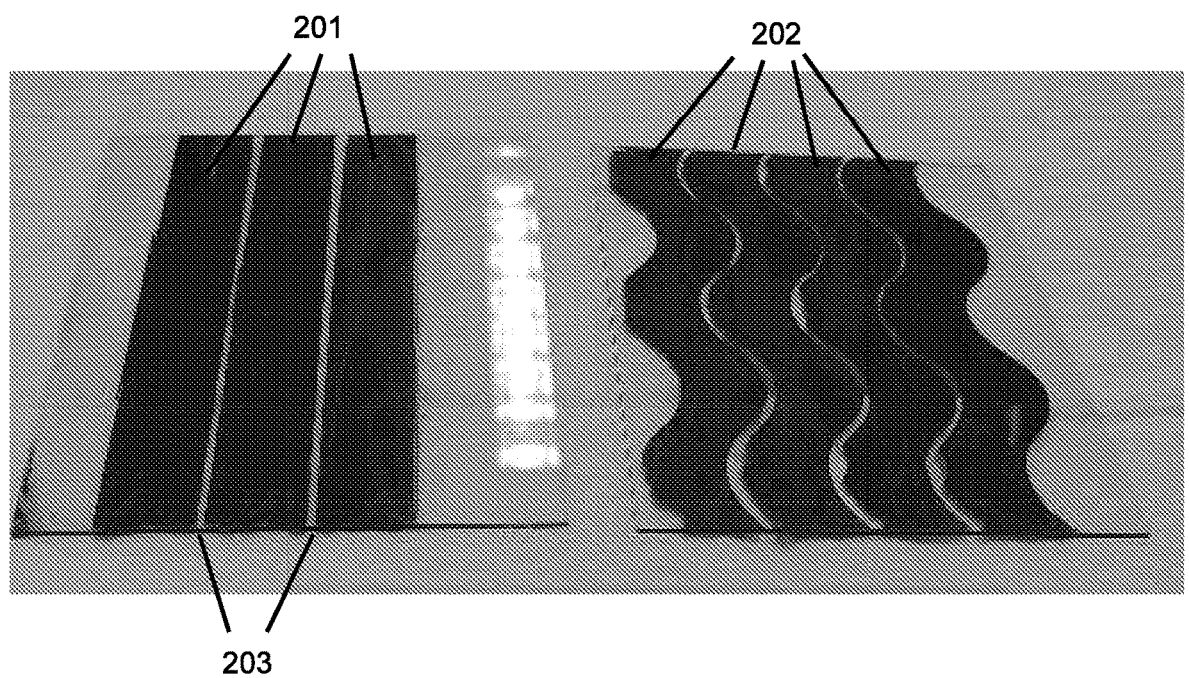
FIG. 6 is a photograph of perovskite films in the form of adjacent rectangular parallel stripes or wavy stripes, produced in Example 2 according to another embodiment of the invention.

In this manner, well-defined closed shapes such as a star, a pentagon and a heart could be selectively covered with a homogeneous perovskite film, as seen in FIG. 5. Furthermore, adjacent rectangular parallel stripes 201 or wavy stripes 202 of perovskite film, as seen in FIG. 6, were produced by drawing a series of non-intersecting hydrophobic ink lines on the substrate, and progressively drop-casting the solution along the length of the regions between each pair of hydrophobic ink lines. The elongated substrate regions were thus selectively covered with perovskite film without the need to completely enclose the region with a hydrophobic ink boundary. Moreover, a single line of hydrophobic ink defined a hydrophobic boundary between adjacent regions of the substrate, thus allowing unconnected films of perovskite to be produced in close proximity, i.e. separated by narrow gaps 203.

Example 3. Preparation of 2D Perovskite Films on a PEDOT:PSS Coated Substrate

Patterned indium tin oxide (ITO) glass was sequentially cleaned in detergent (Deconex 12PA detergent solution), deionized water, acetone, and isopropanol using ultrasonication, and then treated with UV-ozone for 15 min. A PEDOT:PSS solution, prepared by mixing 1 mL PEDOT:PSS dispersion, 1 mL deionized water and 1.6 mL isopropanol, was spin coated onto the patterned ITO glass substrate at 5000 rpm for 30 s. The substrate was then heated on a hotplate at 150° C. for 10 min in air, and cooled to room temperature. The PEDOT:PSS coating had a hydrophilic surface characterized by a water contact angle of 24-25° measured at 1 second after dropping, becoming less than 5° after 10 seconds and then stabilizing.

Figure 7:
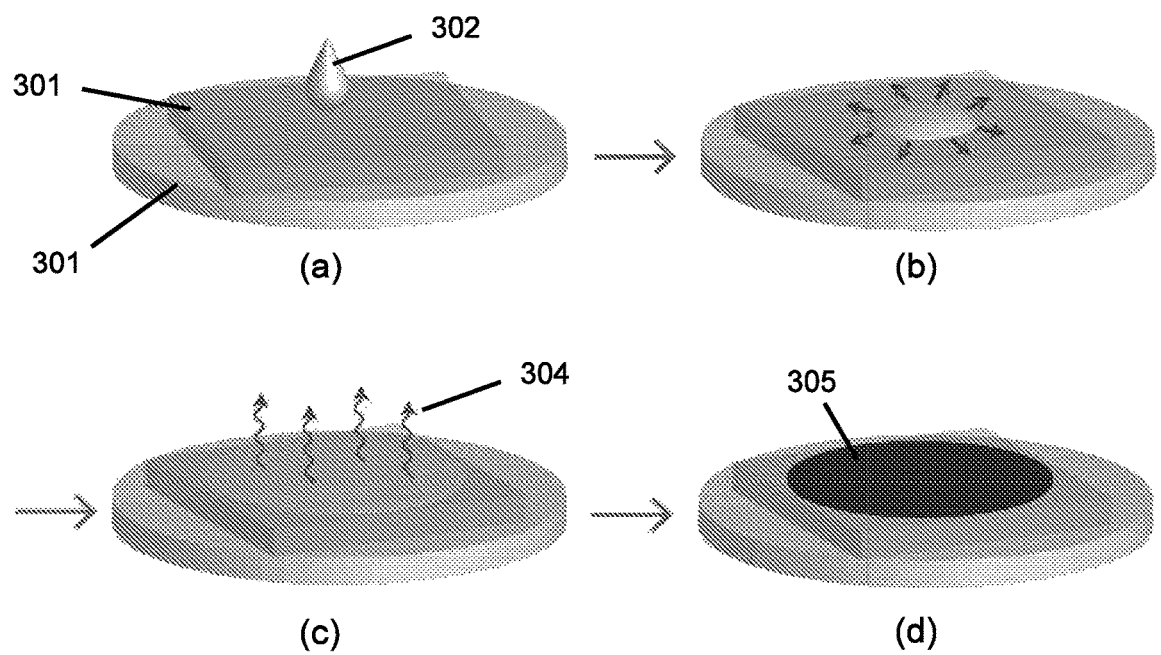
FIG. 7 schematically depicts a method of forming a perovskite film according to an embodiment of the invention employed in Example 3.
Figure 8:
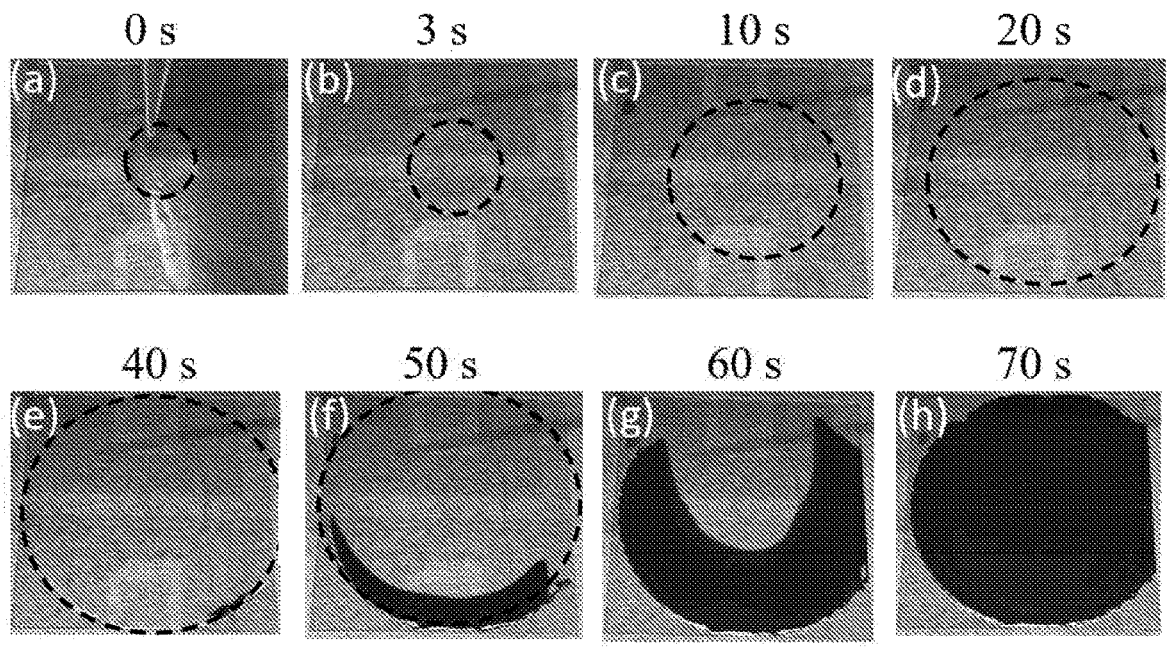
FIG. 8 shows sequential photographs of the spreading and drying of a perovskite precursor solution according to an embodiment of the invention employed in Example 3.

As schematically depicted in FIG. 7, the PEDOT:PSS coated substrates 301 were then placed on a hot plate 302 at 50° C. for at least 2 min in air, and aliquots of $(BA)_2(MA)_3Pb_4I_{13}$ perovskite precursor solution 302, with $Pb^{2+}$ concentration of 0.3 mol $L^{-1}$, were drop cast onto the centre of the substrates, FIG. 7(a). The solution spread isotropically on substrates 301, FIG. 7(b), and dried by thermally induced evaporation of DMF vapour 304 within 2 min, FIG. 7(b), to form approximately circular perovskite films 305 on the substrate surface, FIG. 7(d). The substrates 304 were then further heated at 100° C. for 2 min.

Depicted in FIG. 8(a)-(d) are photographs of the spreading of 60 μL of precursor solution on a PEDOT:PSS coated surface, taking approximately 40 seconds to form a disc with a final diameter of approximately 50 mm (dotted lines indicating the disc periphery are superimposed for clarity). In FIG. 8(e)-(f), it is seen that drying of the wet film initially produced perovskite crystallization at the edge of the disc. Drying and crystallization then propagated rapidly throughout the remainder of the disc, FIG. 8(g), and the process was complete within 70 s, FIG. 8(h). The loading of perovskite in the perovskite film on the substrate was thus approximately 0.0013 mol/$m^2$ mol/$m^2$, based on Pb. The perovskite film was highly reflective, indicating a smooth surface.

Figure 9:
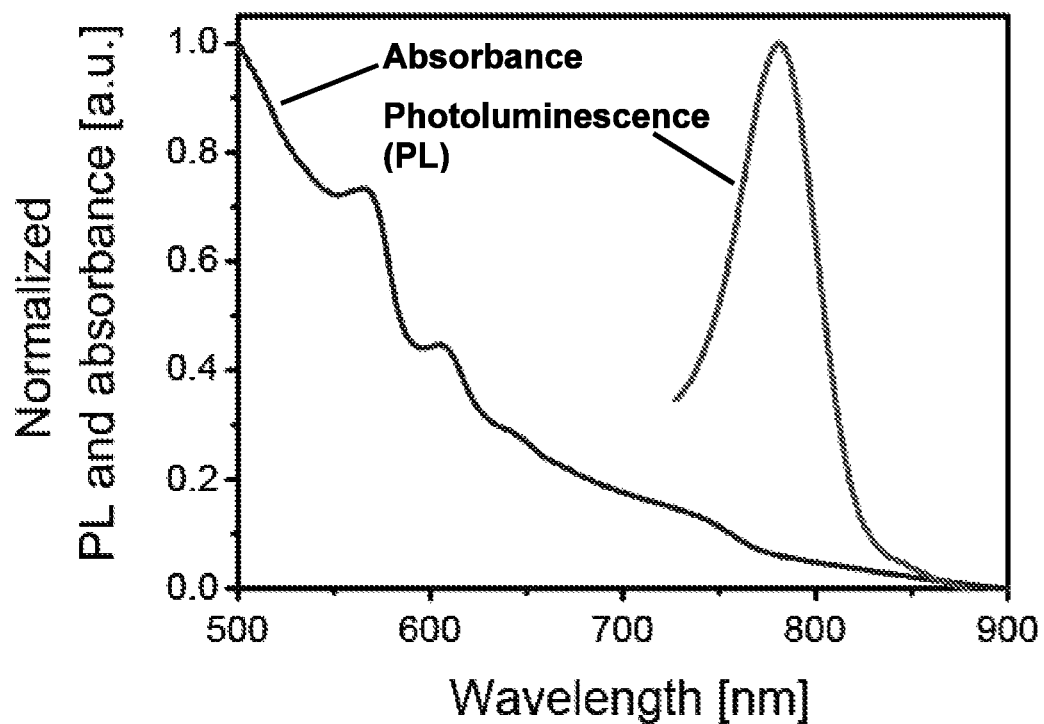
FIG. 9 shows the UV-visible absorption spectrum and photoluminescence (PL) emission spectrum of a perovskite film produced according to an embodiment of the invention employed in Example 3.

Another 2D perovskite film was prepared in the same manner, except that 6 μL of the same precursor solution was drop cast onto the surface and allowed to spread into a disc with diameter of approximately 25 mm. The UV-visible absorption spectrum and photoluminescence (PL) emission spectrum of this perovskite film is depicted in FIG. 9. The spectrum displays absorption peaks at 566 nm, 605 nm, and 643 nm which are characteristic of 2D perovskites, and the absorption onset at 776 nm corresponds to a calculated absorption band-gap of 1.6 eV. The PL emission maximum is at 781 nm.

Figure 10:
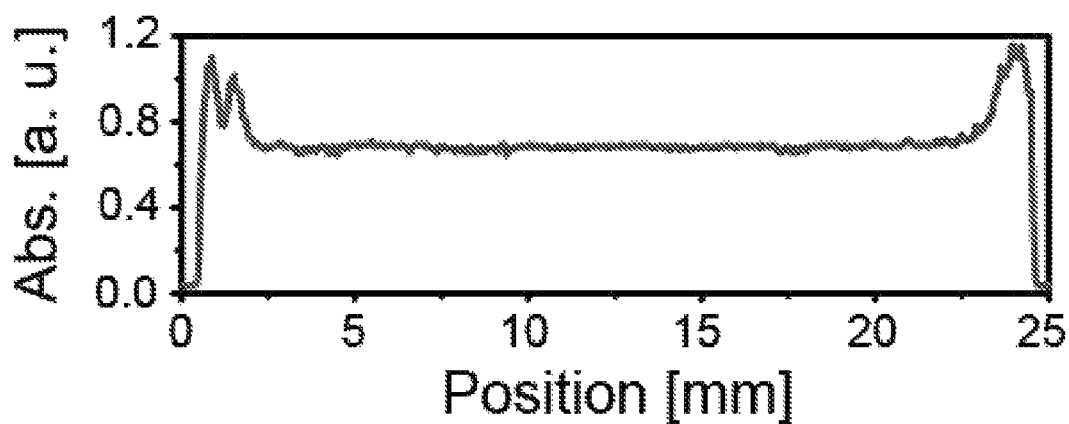
FIG. 10 shows an optical absorption analysis across the diameter of a perovskite film produced according to an embodiment of the invention employed in Example 3.

The result of optical absorption analysis of the same perovskite film is shown in FIG. 10. Apart from the disc extremities, there is very little variation in absorbance across the entire film, indicating that the films have a highly uniform thickness.

Atomic force microscope analysis indicated that the self-assembled 2D perovskite films have compact packing and a smooth surface with a root-mean-square (RMS) roughness of 6.43 nm, a markedly lower roughness than 3D perovskite films prepared using conventional solvent engineering approaches. The grain sizes in the 2D perovskite film are around 1 μm.

Figure 11:
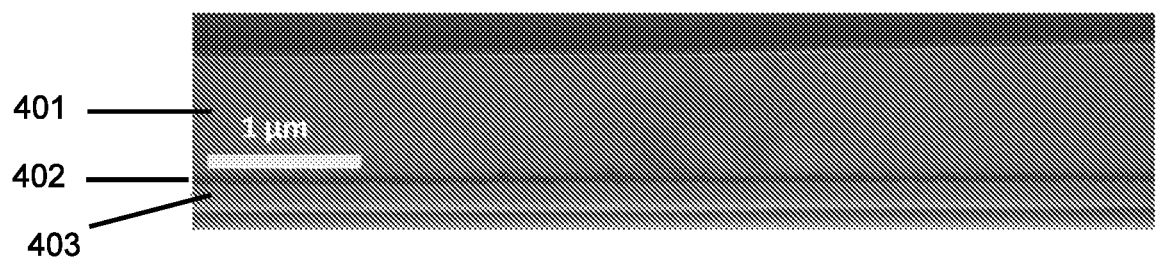
FIG. 11 is a cross-sectional image, taken by scanning electron microscopy, of a perovskite film produced according to an embodiment of the invention employed in Example 3.

Cross-section scanning electron microscopy, depicted in FIG. 11, demonstrates that a homogeneous 2D perovskite film 401, with a thickness of approximately 0.9 μm and a very low surface roughness, was formed on the thin PEDOT:PSS layer 402, itself formed evenly on ITO layer 403.

Figure 12:
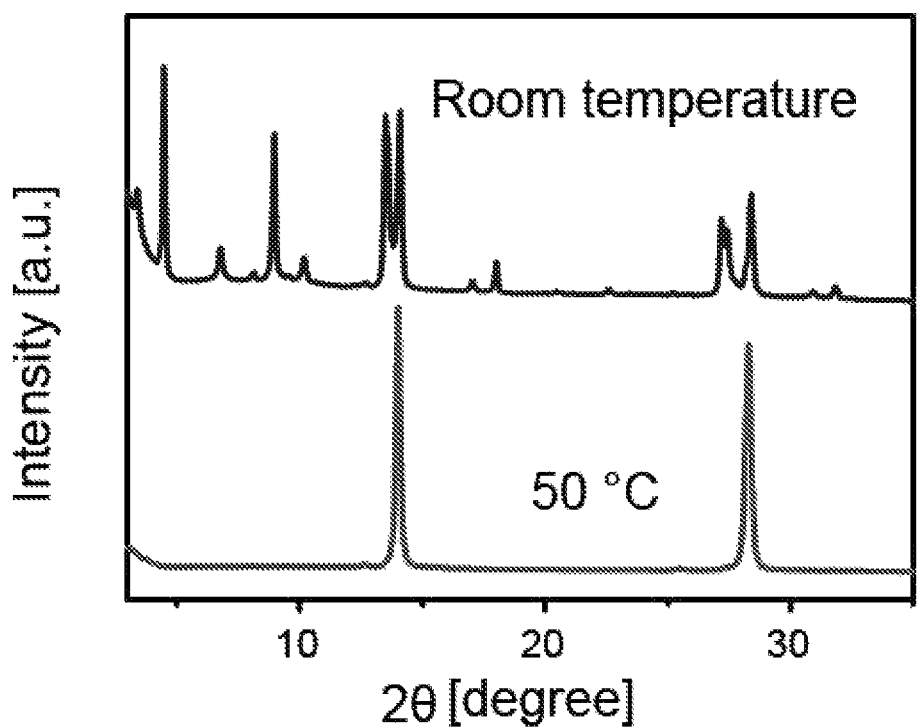
FIG. 12 depicts the X-ray diffraction pattern of perovskite films produced by drying at room temperature and 50° C., according to embodiments of the invention employed in Example 4.

Example 4. The Effect of Temperature 2D perovskite films were again prepared by the method of Example 3, thus drop-casting 6 μL aliquots of $(BA)_2(MA)_3Pb_4I_{13}$ precursor solution with $Pb^{2+}$ concentration of 0.3 mol $L^{-1}$ onto the PEDOT:PSS coated substrate, allowing the film to spread across the PEDOT:PSS surface and drying to form discs of perovskite film. However, the effect of temperature was investigated by comparing results obtained with drop casting and drying on a room temperature substrate vs a substrate heated to 50° C. The resultant films were analyzed by X-ray diffraction (XRD), as depicted in FIG. 12.

Prepared at room temperature, the perovskite film shows a diffraction pattern similar to the calculated powder diffraction pattern, suggesting that the crystals in the film are randomly oriented. In contrast, for a film prepared at 50° C., only two main peaks at 14.04° and 28.28° are observed. These two peaks are characteristic of vertical orientation of the 2D perovskite crystals, i.e. the methylammonium lead-iodide slabs are arranged perpendicularly to the substrate surface. This highly-ordered vertical orientation is desirable for many optoelectronic devices, because it provides efficient charge-transport pathways for photo-generated charge carriers to move from the bulk perovskite to adjacent charge-transport layers.

Example 5. Fabrication and Testing of Solar Cells

Solar cells were prepared entirely in air using the method of Example 3 to produce discs of perovskite film on a 25×25 mm substrates comprising ITO-glass spin coated with PEDOT:PSS. 6 μL aliquots of $(BA)_2(MA)_3Pb_4I_{13}$ precursor solution were drop-cast onto the PEDOT:PSS surface. The effects of drop-casting/drying temperature and precursor solution concentration on solar cell performance were investigated as shown in Tables 1 and 2 below.

$PC_{61}BM$ in chloroform (10 mg mL$^{-1}$) was spin coated onto the 2D perovskite layer at 1000 rpm for 30 s. Then polyethylenimine ethoxylated (PEIE) (0.05% w/w in isopropanol) was spin coated onto the $PC_{61}BM$ layer at 4000 rpm for 30 s. Finally, 100 nm Ag was evaporated through a shadow mask to give an active area of 0.1 cm$^2$.

As seen in Table 1, the optimum solar cell performance was obtained when drop casting and drying the precursor solution at 50-60° C. This result is consistent with the observation in example 4 that elevated temperatures produce vertical orientation of the 2D perovskite crystals on the substrate, and thus improved charge-transport pathways for photo-generated charge carriers to move from the bulk perovskite film into the adjacent charge-transport layers (i.e. PEDOT:PSS and $PC_{61}BM$). While good results were still obtained at 70° C., it is believed that at higher temperatures, i.e. 70° C. and higher, the rate of drying may increasingly become too high to allow the solution to spread evenly on the surface, potentially resulting in uncontrolled disc size, variable film thickness or low quality crystals in the film.

TABLE 1

| Temp [° C.] | Solution Conc [Pb$^{2+}$ mol L$^{-1}$] | $V_{oc}$ [a] [V] | $J_{sc}$ [b] [mA cm$^{-2}$] | FF [c] [%] | PCE [d] [%] |
|---|---|---|---|---|---|
| Room temp | 0.3 | 0.80 | −15.1 | 45.1 | 5.5 (2.5 ± 1.7) |
| 30 | 0.3 | 1.12 | −15.8 | 59.0 | 10.5 (9.4 ± 1.0) |
| 40 | 0.3 | 1.12 | −17.0 | 61.4 | 11.7 (11.3 ± 0.4) |
| 50 | 0.3 | 1.12 | −17.0 | 67.7 | 12.9 (12.4 ± 0.4) |
| 60 | 0.3 | 1.08 | −17.8 | 66.6 | 12.8 (11.9 ± 0.6) |
| 70 | 0.3 | 1.08 | −17.1 | 64.0 | 11.8 (11.2 ± 0.7) |

[a] Open circuit voltage;
[b] short-circuit current density;
[c] fill factor;
[d] Power conversion efficiency (data inside parentheses are the averages of measurements on at least 8 cells and data outside parentheses are the highest values recorded).

As seen in Table 2, the optimum solar cell performance was obtained with $(BA)_2(MA)_3Pb_4I_{13}$ precursor solution concentrations of about 0.5 mol L$^{-1}$ Pb$^{2+}$ or less, with the best result obtained with 0.3 mol L$^{-1}$ Pb$^{2+}$. Film thicknesses of approximately 400 nm could be achieved with this concentration. Solutions of such concentrations were of a suitable viscosity to flow readily over the hydrophilic PEDOT:PSS surface to form a thin wet film, which then dried to produce a homogeneous 2D perovskite layer.

TABLE 2

| Solution Conc [Pb$^{2+}$ mol L$^{-1}$] | Film thickness [nm] | Temp [° C.] | $V_{oc}$ [a] [V] | $J_{sc}$ [b] [mA cm$^{-2}$] | FF [c] [%] | PCE [d] [%] |
|---|---|---|---|---|---|---|
| 0.9 | 1814 | 50 | 1.04 | −11.8 | 61.8 | 7.6 (6.4 ± 1.0) |
| 0.7 | 980 | 50 | 1.08 | −16.4 | 60.6 | 10.7 (10.3 ± 0.3) |
| 0.5 | 639 | 50 | 1.08 | −17.1 | 64.0 | 11.8 (11.4 ± 0.4) |
| 0.3 | 389 | 50 | 1.14 | −18.0 | 64.4 | 13.2 (12.8 ± 0.4) |
| 0.2 | 275 | 50 | 1.08 | −17.5 | 67.8 | 12.8 (11.8 ± 0.7) |

[a] Open circuit voltage;
[b] short-circuit current density;
[c] fill factor;
[d] Power conversion efficiency (data inside parentheses are the averages of measurements on at least 8 cells and data outside parentheses are the highest values recorded).

Figure 13:
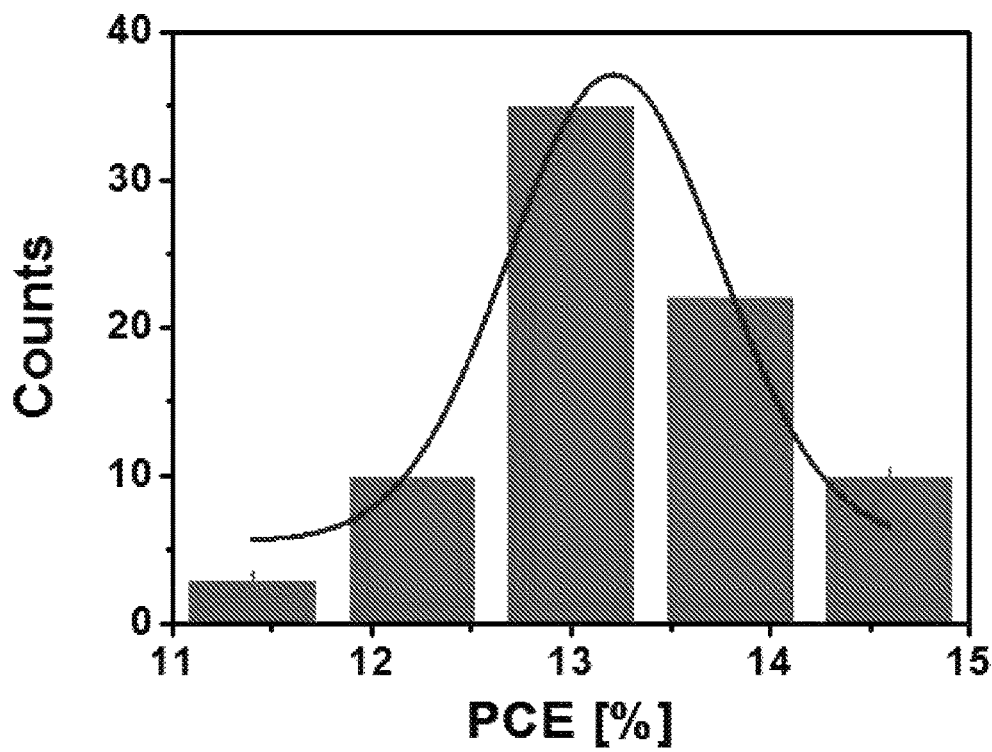
FIG. 13 is a histogram of the power conversion efficiency of solar cells comprising a perovskite layer produced in identical fashion according to an embodiment of the invention, as evaluated in Example 5.

As seen in Tables 1 and 2, the optimum result was obtained for drop casting/drying of a 0.3 mol L$^{-1}$ Pb$^{2+}$ precursor solution at 50° C. A total of 80 cells having an active area of 0.1 cm$^2$ were fabricated using the optimized conditions to explore performance reproducibility. The majority of cells displayed PCEs in the 13-14% range, as depicted in FIG. 13, indicating the robustness of the method even when the perovskite films are prepared in air without any humidity control.

Figure 14:
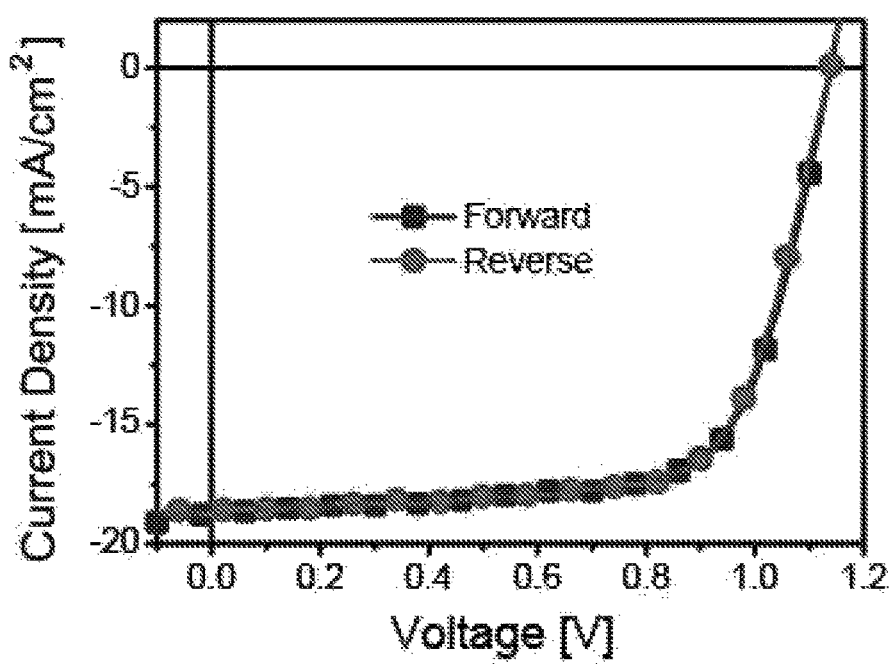
FIG. 14 is a plot of the current density-voltage (J-V) curves obtained by forward and reverse scans of a solar cell comprising a perovskite layer produced according to an embodiment of the invention, as evaluated in Example 5.

The best performing cell provided a $V_{oc}$ of 1.14 V, $J_{sc}$ of 18.8 mA/cm$^2$, FF of 69.5%, and a PCE of 14.9% in forward scan. As seen in FIG. 14, the current density-voltage (J-V) curves obtained by forward and reverse scans show no obvious hysteresis, with a PCE of 14.8% obtained in reverse scan. The steady-state PCE of this cell recorded using maximum power point (MPP) tracking was 14.8%, consistent with the J-V measurement. An integrated photocurrent of 17.8 mA/cm$^2$ was obtained from the external quantum efficiency (EQE) spectrum, which is in satisfactorily good agreement with the results of J-V measurements. The PCE was also found to be highly stable, showing no sign of performance loss after storage in a nitrogen glovebox for more than 5 months.

Example 6. Solar Cells with Different Perovskites

Solar cells were prepared using the method of Example 5, but with a variety of different perovskite precursor solutions (Pb concentration of 0.3 mol $L^{-1}$) as prepared in Example 1. The results are shown in Table 3 below.

on the substrate to form crystalline perovskite film 504. The substrate was then further heated at 100° C. for 2 min on another hot plate. $PC_{61}BM$, PEIE, and Ag layers were then deposited as described in Example 5 to form the solar cells.

The thickness of the resultant perovskite film was similar to that of the best devices produced in example 5, i.e.

TABLE 3

| Perovskite structure | Temp [° C.] | $V_{oc}{}^a$ [V] | $J_{sc}{}^b$ [mA cm$^{-2}$] | FF $^c$ [%] | PCE $^d$ [%] |
|---|---|---|---|---|---|
| $(BA)_2(MA)_3Pb_4I_{13}$ (BA = butyl ammonium) | 50 | 1.14 | −18.0 | 64.4 | 13.2 (12.8 ± 0.4) |
| $(BA)_2(MA)_4Pb_5I_{16}$ (BA = butyl ammonium) | 50 | 1.16 | −19.71 | 62.8 | 14.36 (13.63 ± 0.63) |
| $(iso-BA)_2(MA)_4Pb_5I_{16}$ (iso-BA = isobutyl ammonium) | 50 | 1.14 | 17.26 | 78.52 | 15.45 (15.06 ± 0.30) |
| $(PEA)_2(MA)_4Pb_5I_{16}$ (PEA = phenylethyl ammonium) | 50 | 1.04 | −17.46 | 51.87 | 9.42 (8.82 ± 0.44) |
| $(PentA)_2(MA)_4Pb_5I_{16}$ (PentA = pentyl ammonium) | 50 | 1.08 | −18.28 | 60.83 | 12.01 (11.20 ± 0.60) |
| $(PropA)_2(MA)_4Pb_5I_{16}$ (PropA = propyl ammonium) | 50 | 1.08 | −18.38 | 59.17 | 11.74 (11.20 ± 0.33) |

$^a$ Open circuit voltage;
$^b$ short-circuit current density;
$^c$ fill factor;
$^d$ Power conversion efficiency (data inside parentheses are the averages of measurements on at least 8 cells and data outside parentheses are the highest values recorded).

The results demonstrate the generality of the methods for a range of different $R_2A_{n-1}Pb_nX_{3n+1}$ perovskite precursor solutions, including with different organic cations R and n values. The best result was obtained with $(iso-BA)_2(MA)_4Pb_5I_{16}$, which gave a PCE of 15.45.

Example 7. Fabrication and Testing of Solar Cells by Slot-Die Coating (Comparative)

Figure 15:
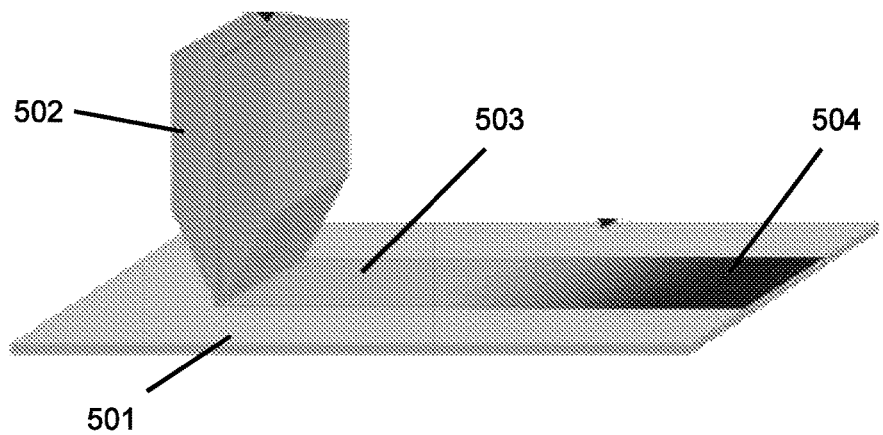
FIG. 15 schematically depicts a method of slot-die coating a perovskite precursor solution onto a substrate, as employed in Example 7.

An ITO glass substrate (5 cm×5 cm) with PEDOT:PSS coating was prepared as described in Example 3. As schematically depicted in FIG. 15, the PEDOT:PSS coated surface of substrate 501, heated to 50° C., was coated with the $(BA)_2(MA)_3Pb_4I_{13}$ 2D perovskite precursor solution containing 0.7 mol $L^{-1}$ $Pb^{2+}$ using a slot die coating apparatus 502. The coating speed was 9 mm s$^{-1}$ and the slot dimensions were 13 mm width and 25 mm length. Under these conditions, the viscosity and loading rate of the precursor solution was such that the applied liquid layer 503 did not flow outwardly over the substrate surface, but instead remained substantially within the rectangular strip defined by the slot width. Once applied, the precursor solution dried approximately 400 nm. However, the uniformity of the slot-die deposited perovskite film was inferior, with some pinholes being observed.

The solar cell performance of a number of identically produced cells was evaluated as described in Example 5. The comparative results for the best performing solar cells produced using slot die coating vs using the method of Example 5 are presented in Table 4 below. Evident from the results is the superior performance obtained by applying the low concentration precursor and allowing it to flow over the hydrophilic substrate before thermally drying.

TABLE 4

| Solution Conc [Pb$^{2+}$ mol L$^{-1}$] | Method | Temp [° C.] | $V_{oc}{}^a$ [V] | $J_{sc}{}^b$ [mA cm$^{-2}$] | FF $^c$ [%] | PCE $^d$ [%] |
|---|---|---|---|---|---|---|
| 0.7 | Ex 6 (slot die) | 50 | 1.06 | −16.6 | 70.9 | 12.5 |
| 0.3 | Ex 3 (drop & flow) | 50 | 1.14 | −18.8 | 69.5 | 14.9 |

$^a$ Open circuit voltage;
$^b$ short-circuit current density;
$^c$ fill factor;
$^d$ Power conversion efficiency.

Example 8. Preparation of Shaped 2D Perovskite Films, with Varying Thickness, on a PEDOT:PSS Coated Substrate ITO glass substrates (5 cm×5 cm) with PEDOT:PSS coating were prepared as described in Example 3. A syringe needle was then used to draw hydrophobic lines, in the shape of a square (c.a. 25 mm×25 mm), onto the surface of the PEDOT:PSS coating, as described in example 2.

The substrates were then placed on a hot plate in air and heated to 50° C. The $(BA)_2(MA)_3Pb_4I_{13}$ precursor solution with $Pb^{2+}$ concentration of 0.3 mol $L^{-1}$ was then drop cast onto the hydrophilic PEDOT:PSS surface in the target square and allowed to flow isotropically across the surface. The polar precursor solution wetted the surface and thus spread as a thin film across the surface. Once the liquid precursor solution reached the boundary lines, it was repelled by the hydrophobic ink and thus retained within the square region. Within less than two minutes, the clear yellow wet films dried to form perovskite films.

Figure 16:
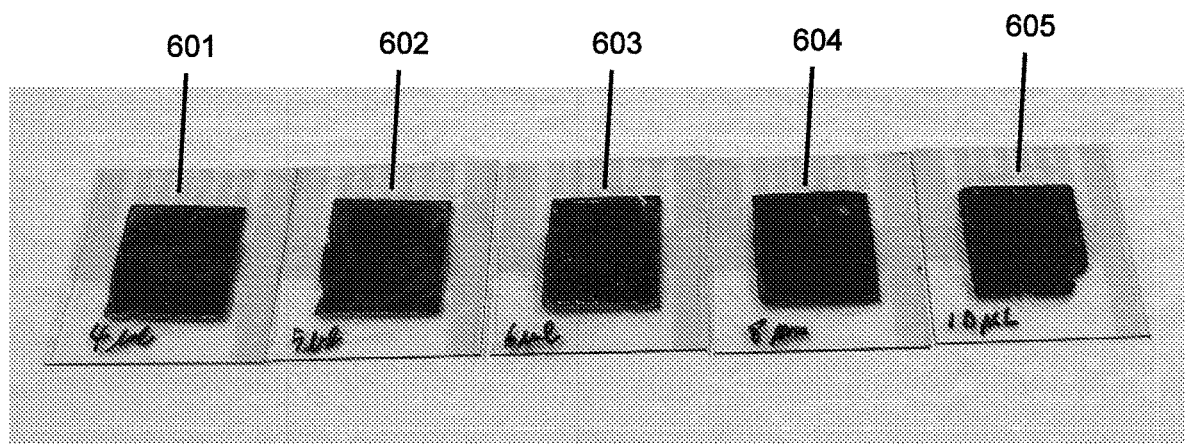
FIG. 16 is a photograph of perovskite films of different thickness, produced by applying varying volumes of perovskite precursor solution to hydrophilic regions of similar square dimensions in Example 8, according to embodiments of the invention.

Volumes of 4, 5, 6, 8 and 10 μL were dropped onto similarly sized squares in this way. The resulting perovskite square films, numbered as 601, 602, 603, 604 and 605 respectively, are depicted in FIG. 16.

Figure 17:
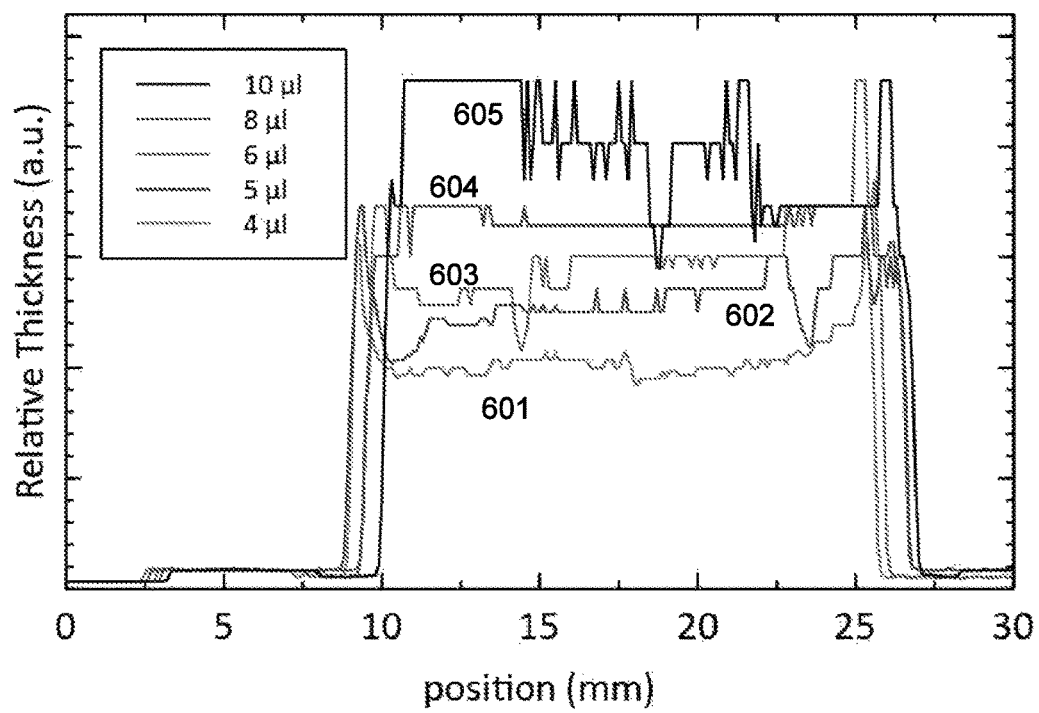
FIG. 17 shows optical absorption analysis across the width of the perovskite films shown in FIG. 16.

The result of optical absorption analysis of these perovskite films is shown in FIG. 17. It can be seen that the absorption of the film correlates with the volume of precursor solution added, as a result of the constraint of the wet film within the hydrophobic boundary. Accordingly, the perovskite film thickness can be controlled based on the volumetric loading of the precursor solution.

Example 9. Preparation of Shaped 2D Perovskite Films on a PEDOT:PSS Coated Substrate A polyethylene terephthalate (PET) film substrate was coated with a thin rectangular strip (width of 13 mm) of PEDOT:PSS using a slot die coating apparatus. The PEDOT:PSS coating had a hydrophilic surface characterized by a water contact angle of less than 5°. By contrast the uncoated PET substrate had a water contact angle of 67-68°, with a very stable droplet that did not spread over the surface.

The substrate was placed on a hot plate in air and heated to 50° C. A syringe was used to dispense a line of the perovskite precursor solution with $Pb^{2+}$ concentration of 0.3 mol along the centre of the PEDOT:PSS coated strip. The substrate was moved beneath the syringe at a speed of 0.2 m/s, and the precursor solution was dispensed at 25 μL/min. Once applied, the precursor solution flowed outwardly across the hydrophilic PEDOT:PSS surface as a thin film. However, once the liquid precursor solution reached the hydrophobic boundary defined by the PET film adjacent the edge of the PEDOT:PSS coating, it was repelled by the hydrophobic PET and thus retained within the rectangular strip. Within less than two minutes of drying on the hot plate, the clear yellow wet film transformed into crystalline perovskite. Thus, as depicted in FIG. 18, a rectangular strip of crystalline perovskite film 701, having the same width as that of the underlying PEDOT:PSS layer 702 (indicated for clarity with dotted lines) on PET substrate 703, was formed.

Example 10 (Comparative)

Two parallel hydrophobic lines approximately 1 cm apart were drawn on an ITO-glass substrate (2.5×2.5 cm), according to the method of Example 2, using a PTAA (poly[bis(4-phenyl)(2,4,6-trimethylphenyl)amine poly(triarylamine) solution (2 mg $mL^{-1}$ in chlorobenzene) and drying for 5 minutes in air.

The $(BA)_2(MA)_3Pb_4I_{13}$ perovskite precursor solution (c.a. 200 μl), with $Pb^{2+}$ concentration of 0.3 mol $L^{-1}$, was then dropped onto the substrate so that the substrate was fully covered by a thin layer of the solution. This was done separately at either room temperature or 60° C. In both cases, the solution did not dewet to form disconnected perovskite precursor films separated by the hydrophobic lines. At 60° C., the precursor solution dried over a period of c.a. 6 minutes without dewetting to form a non-uniform perovkite film which extended over the hydrophobic lines. The results demonstrate that arbitrarily shaped perovkite films are not formed on a substrate containing hydrophilic and hydrophobic regions by flooding the substrate with precursor solution unless the substrate is subjected to spinning to induce dewetting.

Those skilled in the art will appreciate that the invention described herein is susceptible to variations and modifications other than those specifically described. It is understood that the invention includes all such variations and modifications which fall within the spirit and scope of the present invention.

The invention claimed is:

1. A method of forming a perovskite film for an optoelectronic device, comprising:
    applying a perovskite precursor solution to at least one part of a hydrophilic region of a substrate, wherein the hydrophilic region is bounded by a hydrophobic boundary and wherein the perovskite precursor solution is applied selectively to the hydrophilic region;
    allowing the perovskite precursor solution to spread over the hydrophilic region in response to adhesive forces between the perovskite precursor solution and a surface of the hydrophilic region and without spinning the hydrophilic region, wherein the perovskite precursor solution spreads until it reaches, and is retained within the hydrophilic region by, at least a portion of the hydrophobic boundary; and
    drying the perovskite precursor solution to form a perovskite film on the hydrophilic region,
    wherein the perovskite film comprises a hybrid organic-inorganic perovskite crystalline structure comprising metal cations, organic cations and halide ions.

2. The method according to claim 1, wherein a water contact angle of the hydrophilic region is less than 45° as determined by placing a 2 μL droplet on a dried surface and measuring the water contact angle using a water contact angle measuring system.

3. The method according to claim 1, wherein the perovskite precursor solution has a viscosity in the range of 0.6 to 600 mPa·s.

4. The method according to claim 1, wherein the perovskite precursor solution on the hydrophilic region has a temperature of at least 30° C. during the drying.

5. The method according to claim 1, further comprising heating the substrate to a temperature in the range of 40° C. to 80° C. at least one of before, during and after the applying.

6. The method according to claim 1, wherein a volume of the perovskite precursor solution sufficient to cover the entire hydrophilic region is applied, wherein the volume is selected to produce a target thickness of the perovskite film based on a known surface area of the hydrophilic region and a known concentration of the perovskite precursor solution.

7. The method according to claim 1, wherein the substrate comprises a surface layer comprising a hydrophilic composition, wherein the hydrophilic region is on the surface layer, wherein the surface layer has a thickness of between about 20 nm and about 2000 nm.

8. The method according to claim 1, wherein the hydrophilic region comprises a hydrophilic composition selectively located on a hydrophobic surface of the substrate, wherein the hydrophobic surface adjacent to the hydrophilic region defines the hydrophobic boundary.

9. The method according to claim 8, wherein the hydrophilic composition is a hydrophilic semiconductor configured to transport charge to and/or from the perovskite film.

10. The method according to claim 1, wherein the hydrophilic region is a region of a hydrophilic surface of the substrate, wherein the substrate comprises a hydrophobic composition selectively located on the hydrophilic surface adjacent to the hydrophilic region which defines the hydrophobic boundary.

11. The method according to claim 10, wherein the hydrophobic composition comprises at least one component selected from the group consisting of hydrophobic polymers, hydrophobic organic small molecules, metals, and metal oxides.

12. The method according to claim 10, wherein the hydrophobic composition is present at least partially as a line on the hydrophilic surface, wherein the line defines a hydrophobic boundary of adjacent hydrophilic regions of the substrate, and wherein the perovskite precursor solution is separately applied to parts of each of the adjacent hydrophilic regions to form unconnected perovskite films on the adjacent hydrophilic regions.

13. The method according to claim 1, wherein the perovskite precursor solution is a lead (Pb) perovskite precursor solution and wherein a concentration of Pb in the perovskite precursor solution is less than 0.7 mol/liter.

14. The method according to claim 1, wherein the perovskite precursor solution is a 2D perovskite precursor solution, wherein the 2D perovskite is of the form $R_xA_{n-1}Pb_nX_{3n+1}$, wherein each A is independently an organic cation selected from the group consisting of methylammonium (MA) and formamidinium (FA), each R is an organic cation larger than each A and each X is independently a halide anion.

15. The method according to claim 1, wherein applying the perovskite precursor solution comprises drop casting the perovskite precursor solution onto the hydrophilic region or applying a line of the perovskite precursor solution to the hydrophilic region.

16. The method according to claim 1, wherein the applying comprises feeding the substrate in the form of a web beneath an applicator, wherein the applicator applies the perovskite precursor solution to the at least one part of the hydrophilic region as the hydrophilic region is fed past the applicator.

17. The method according to claim 1, wherein the perovskite precursor solution comprises divalent metal ions, monovalent organic cations, and halide anions.

18. The method according to claim 17, wherein the divalent metal ions are selected from Pb2+ and Sn2+.

19. The method according to claim 17, wherein at least a portion of the monovalent organic cations are selected from methyl ammonium and formamidinium.

20. The method according to claim 17, wherein at least a portion of the monovalent organic cations are selected from phenylethyl ammonium, butyl ammonium, isobutyl ammonium, pentyl ammonium, and propyl ammonium.

21. The method according to claim 1, wherein the optoelectronic device is a solar cell, and wherein the perovskite film is capable of absorbing visible light, thereby photovoltaically generating electrons and holes.

* * * * *